US010777437B2

(12) United States Patent
Fukasawa

(10) Patent No.: US 10,777,437 B2
(45) Date of Patent: Sep. 15, 2020

(54) STORAGE UNIT, TRANSFER APPARATUS, AND SUBSTRATE PROCESSING SYSTEM

(71) Applicant: TOKYO ELECTRON LIMITED, Tokyo (JP)

(72) Inventor: Takami Fukasawa, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 332 days.

(21) Appl. No.: 15/187,989

(22) Filed: Jun. 21, 2016

(65) Prior Publication Data
US 2016/0379855 A1    Dec. 29, 2016

(30) Foreign Application Priority Data

Jun. 24, 2015  (JP) ................ 2015-126402

(51) Int. Cl.
*H01L 21/67*    (2006.01)
*H01L 21/673*   (2006.01)
*H01L 21/677*   (2006.01)

(52) U.S. Cl.
CPC .... *H01L 21/6732* (2013.01); *H01L 21/67017* (2013.01); *H01L 21/6719* (2013.01); *H01L 21/67028* (2013.01); *H01L 21/67207* (2013.01); *H01L 21/67389* (2013.01); *H01L 21/67393* (2013.01); *H01L 21/67769* (2013.01); *H01L 21/67778* (2013.01)

(58) Field of Classification Search
CPC ............... H01L 21/67393; H01L 21/67389
See application file for complete search history.

(56) References Cited

U.S. PATENT DOCUMENTS

| 5,482,068 A | * | 1/1996 | Kitahara | ............... B08B 3/04 |
| | | | | 134/182 |
| 5,879,458 A | * | 3/1999 | Roberson, Jr. | .... H01L 21/67017 |
| | | | | 118/715 |
| 6,273,107 B1 | * | 8/2001 | Adams | .................. B08B 3/102 |
| | | | | 134/102.1 |

(Continued)

FOREIGN PATENT DOCUMENTS

JP    2010-225641 A    10/2010

OTHER PUBLICATIONS

An Office Action mailed by the Taiwan Intellectual Property Office dated Nov. 29, 2019, which corresponds to Taiwanese Patent Application No. 105119623 and is related to U.S. Appl. No. 15/187,989.

*Primary Examiner* — Mark C Hageman
(74) *Attorney, Agent, or Firm* — Studebaker & Brackett PC

(57) ABSTRACT

A storage unit of an embodiment includes a container, a rectifying plate, and an exhaust duct. The container provides a first space for storing a plurality of substrates therein, and a second space behind the first space. The rectifying plate is provided between the first and second spaces. The exhaust duct communicates with the second space. The rectifying plate has an effective region facing the first space. The effective region includes a first region and a second region. The first region faces a center of the first space. The second region extends on one side or both sides of the first region. In the first region, a plurality of through holes are formed to be distributed over the first region. The second region has a conductance lower than a conductance of the first region.

14 Claims, 20 Drawing Sheets

(56) References Cited

U.S. PATENT DOCUMENTS

| | | | |
|---|---|---|---|
| 6,364,922 B1 | 4/2002 | Tanaka et al. | |
| 6,875,282 B2 * | 4/2005 | Tanaka | G03F 1/66 118/719 |
| 6,899,145 B2 * | 5/2005 | Aggarwal | H01L 21/67393 141/11 |
| 9,666,454 B2 * | 5/2017 | Choi | H01L 21/6732 |
| 9,704,727 B2 * | 7/2017 | Segawa | H01L 21/67017 |
| 2015/0107770 A1 | 4/2015 | Choi et al. | |
| 2015/0364346 A1 * | 12/2015 | Woo | H01L 21/67017 15/405 |
| 2016/0284580 A1 * | 9/2016 | Woo | H01L 21/67393 |
| 2017/0011942 A1 * | 1/2017 | Woo | H01L 21/6732 |

* cited by examiner

*Fig.7*
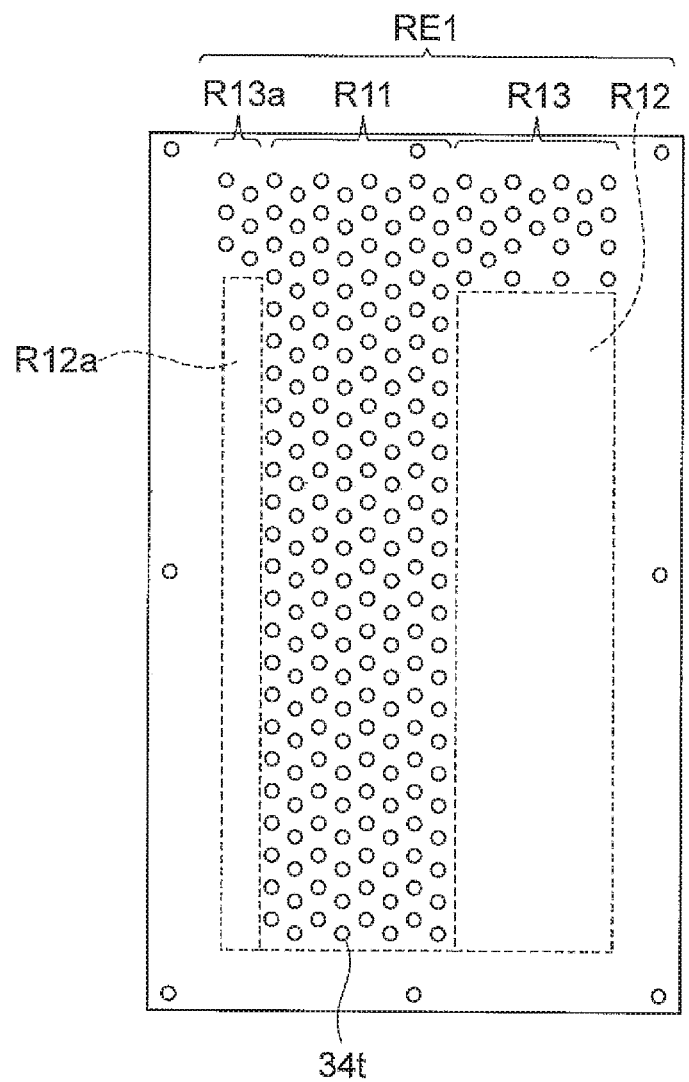
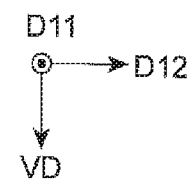

Fig.9
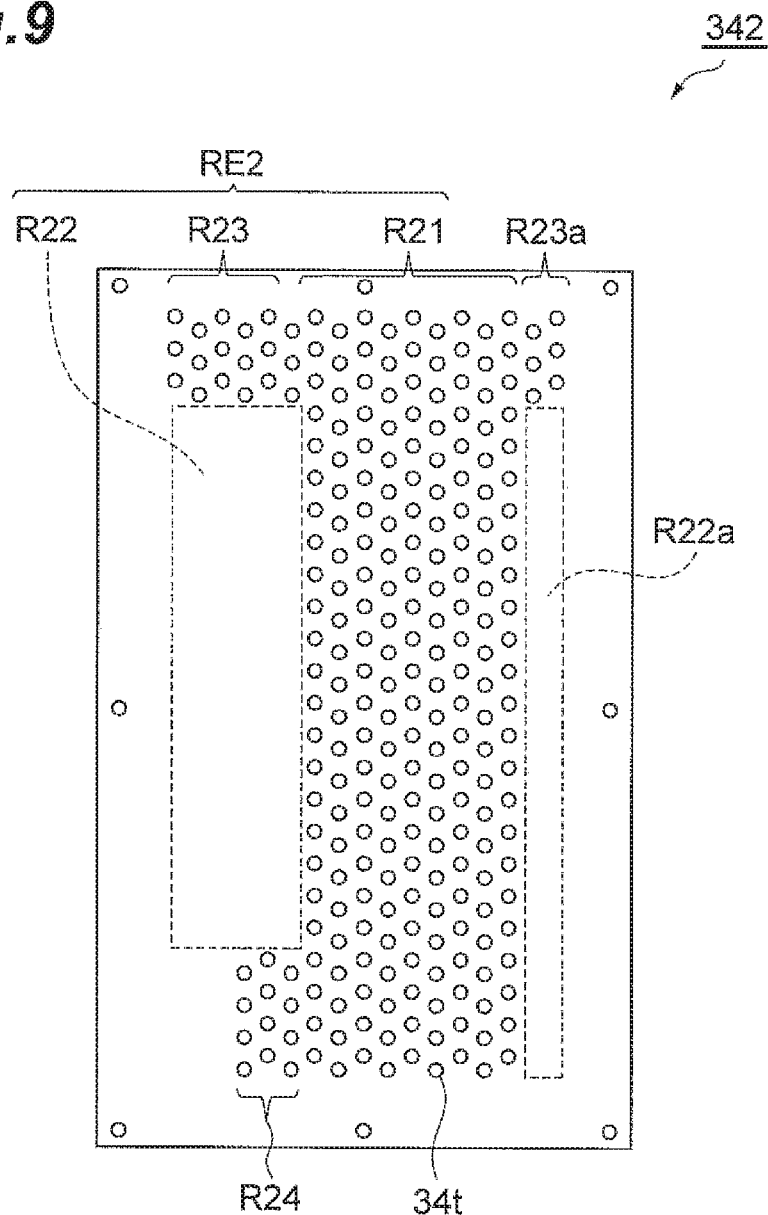
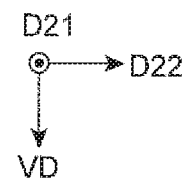

Fig.13
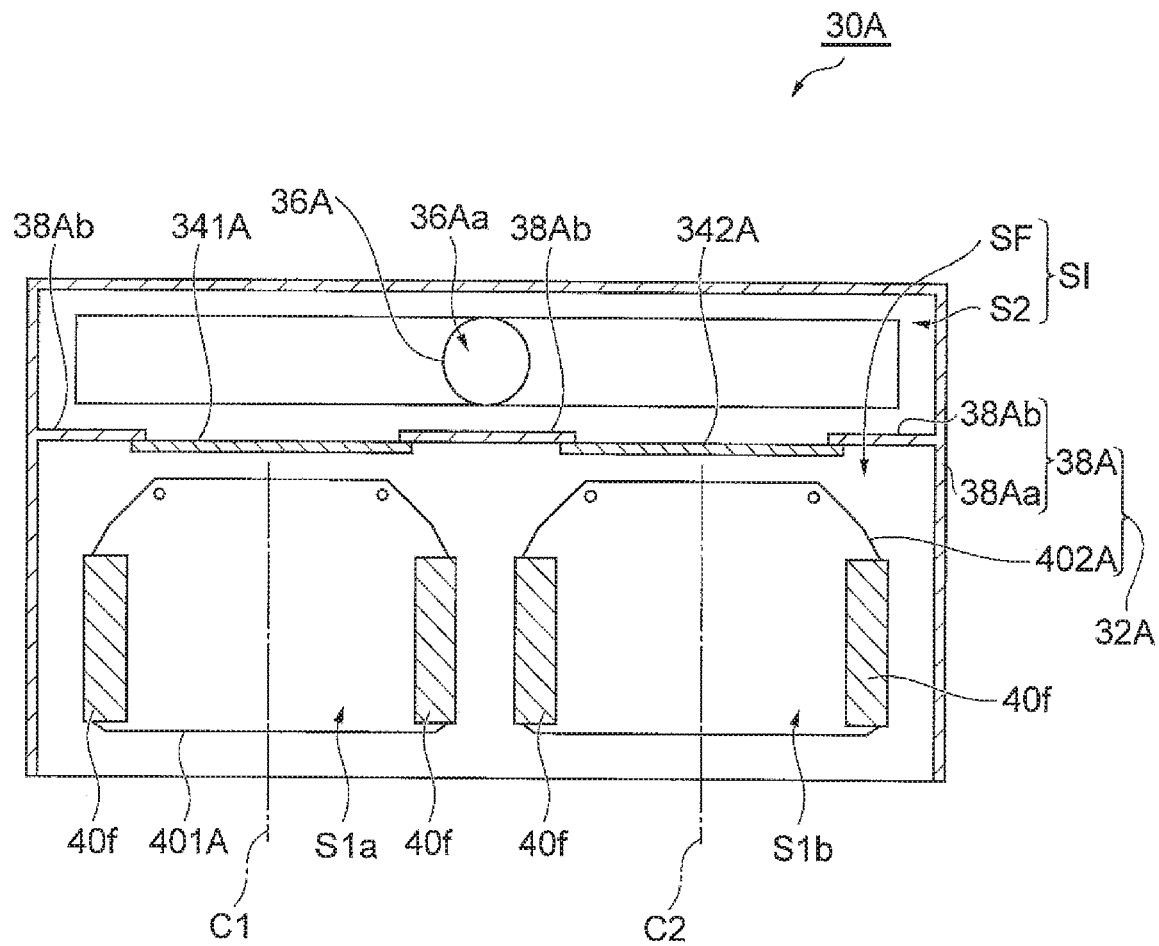
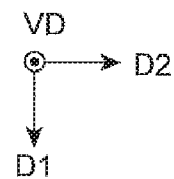

Fig.16
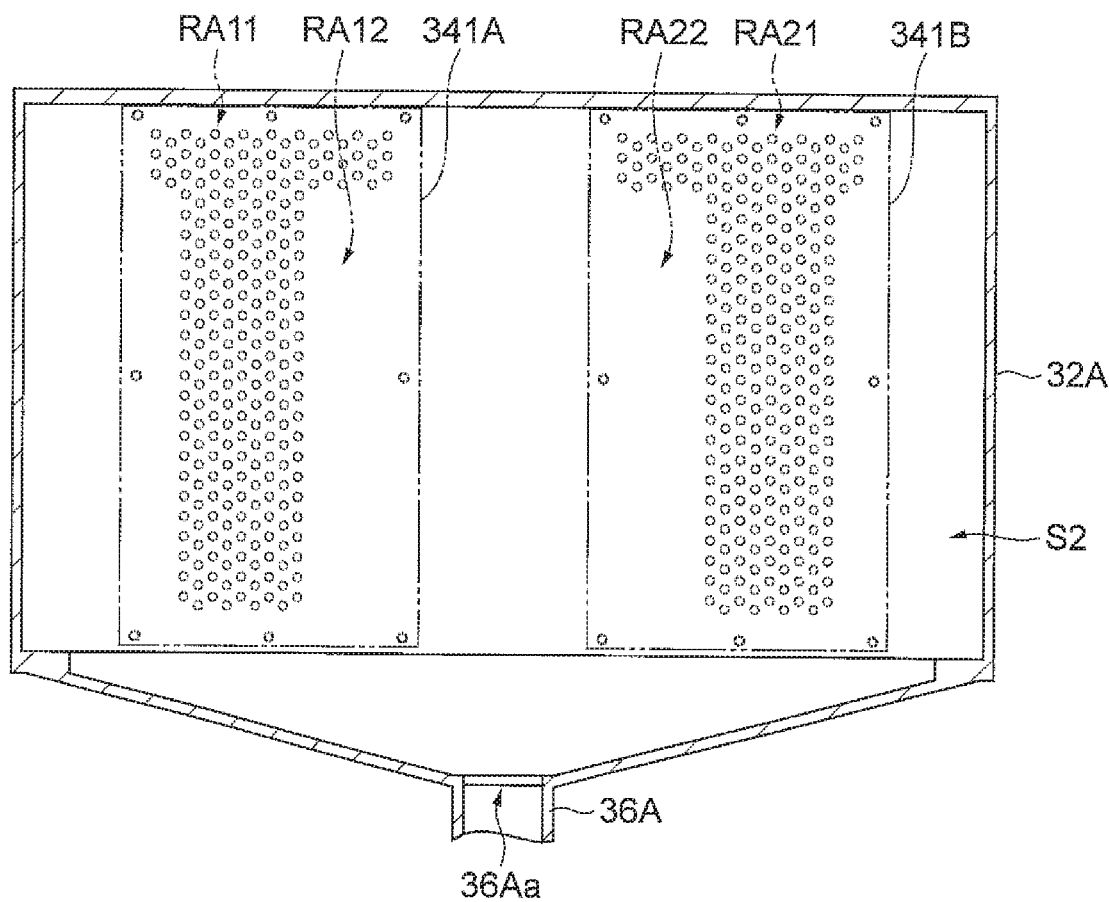
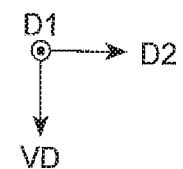

Fig.18
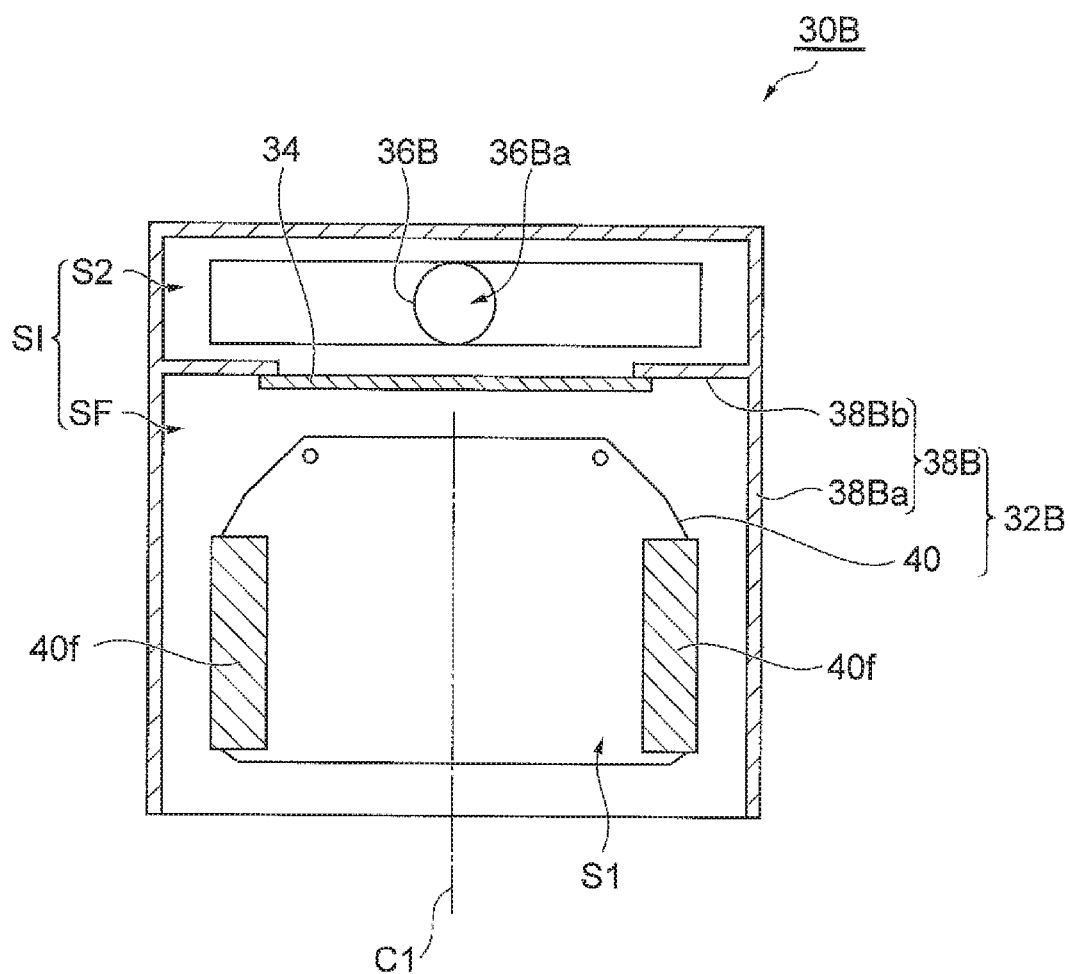
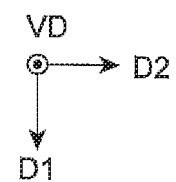

STORAGE UNIT, TRANSFER APPARATUS, AND SUBSTRATE PROCESSING SYSTEM

CROSS-REFERENCE TO RELATED APPLICATIONS

This application, is based on and claims the benefit of priority from Japanese Patent Application No. 2015-426402 filed on Jun. 24, 2015, and the entire contents of which are incorporated herein by reference.

BACKGROUND

Field

Exemplary embodiments of the present disclosure relate to a storage unit which stores a substrate for cleaning, a transfer apparatus which includes the storage unit, and a substrate processing system which includes the transfer apparatus.

Related Background Art

In manufacturing of an electronic device, a substrate processing system is used. In general, the substrate processing system includes a loader module, a load lock module, a transfer module, and a plurality of process modules.

The loader module is a transfer apparatus which transfers a substrate under an atmospheric pressure environment. The loader module provides a transfer chamber which, is set to an atmospheric pressure, and includes a transfer robot in the transfer chamber. The transfer robot of the loader module is configured to transfer the substrate between a front opening unified pod (FOUP) and the load lock module.

The load lock module provides a preliminary depressurized chamber, and is provided between the loader module and the transfer module. The transfer module provides a depressurizable transfer chamber, and includes a transfer robot in the transfer chamber. The transfer robot of the transfer module transfers a wafer between the load lock module and the plurality of process modules. Each of the plurality of process modules is a substrate processing apparatus which is configured to perform dedicated processing of a substrate such as plasma etching, film forming, or heat treatment.

In the substrate processing system, the wafer taken out from the FOUP is transferred into the process module via the loader module, the load lock module, and the transfer module. Subsequently, the substrate is processed in one or more process modules. The processed substrate is returned to the FOUP via the transfer module, the load lock module, and the loader module. Such a substrate processing system is described in, for example, Japanese patent application Laid-Open Publication No. 2010-225641.

SUMMARY

In an aspect, there is provided a storage unit which stores a substrate for cleaning. That is, there is provided a storage unit which has a purge function. The storage unit includes a container, a rectifying plate, and an exhaust duct. The container is open to a front side, and provides a first space in which a plurality of substrates are to be stacked in a vertical direction, and a second space behind the first space. The rectifying plate is provided between the first space and the second space. The exhaust duct communicates with the second space. The rectifying plate has an effective region which faces the first space along a first direction, the first direction being orthogonal to the rectifying plate. The effective region includes a first region and a second region. The first region is a region which faces a center of the first space in a second direction orthogonal to the first direction orthogonal and the vertical direction. That is, the first region is a region which faces the center of each of the plurality of substrates along the first direction. The second region extends on one side or both sides of the first region in the second direction. A plurality of through holes are formed in the first region to be distributed over the first region. The second region has a conductance which is lower than a conductance of the first region.

In another aspect, there is provided a transfer apparatus. That is, a loader module configured to transfer a substrate under an atmospheric pressure environment is provided. The transfer apparatus includes a chamber body, a transfer robot, and the above-described storage unit, and a blower. The chamber body provides a transfer chamber. The transfer robot is provided in the transfer chamber. The storage unit is connected to the chamber body, the first space communicating with the transfer chamber. The blower is configured to generate a flow of gas toward the transfer chamber and the first space.

In still another aspect, there is provided a substrate processing system. The substrate processing system includes the above-described transfer apparatus, a load lock module, a transfer module, and a process module. The load lock module provides a preliminary depressurized chamber, and is connected to the chamber body of the transfer apparatus. The transfer module provides a depressurizable transfer chamber, includes the transfer robot in the transfer chamber, and is connected to the load lock module. The process module is a module for processing a substrate, and is connected to the transfer module.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 7 is a plan view illustrating a rectifying plate.

FIG. 9 is a plan view illustrating a rectifying plate.

FIG. 13 is a sectional view illustrating the storage unit according to another exemplary embodiment.

FIG. 16 is a sectional view of the storage unit shown in FIG. 12.

FIG. 18 is a sectional view illustrating a storage unit according to still another exemplary embodiment.

DETAILED DESCRIPTION

Figure 1:
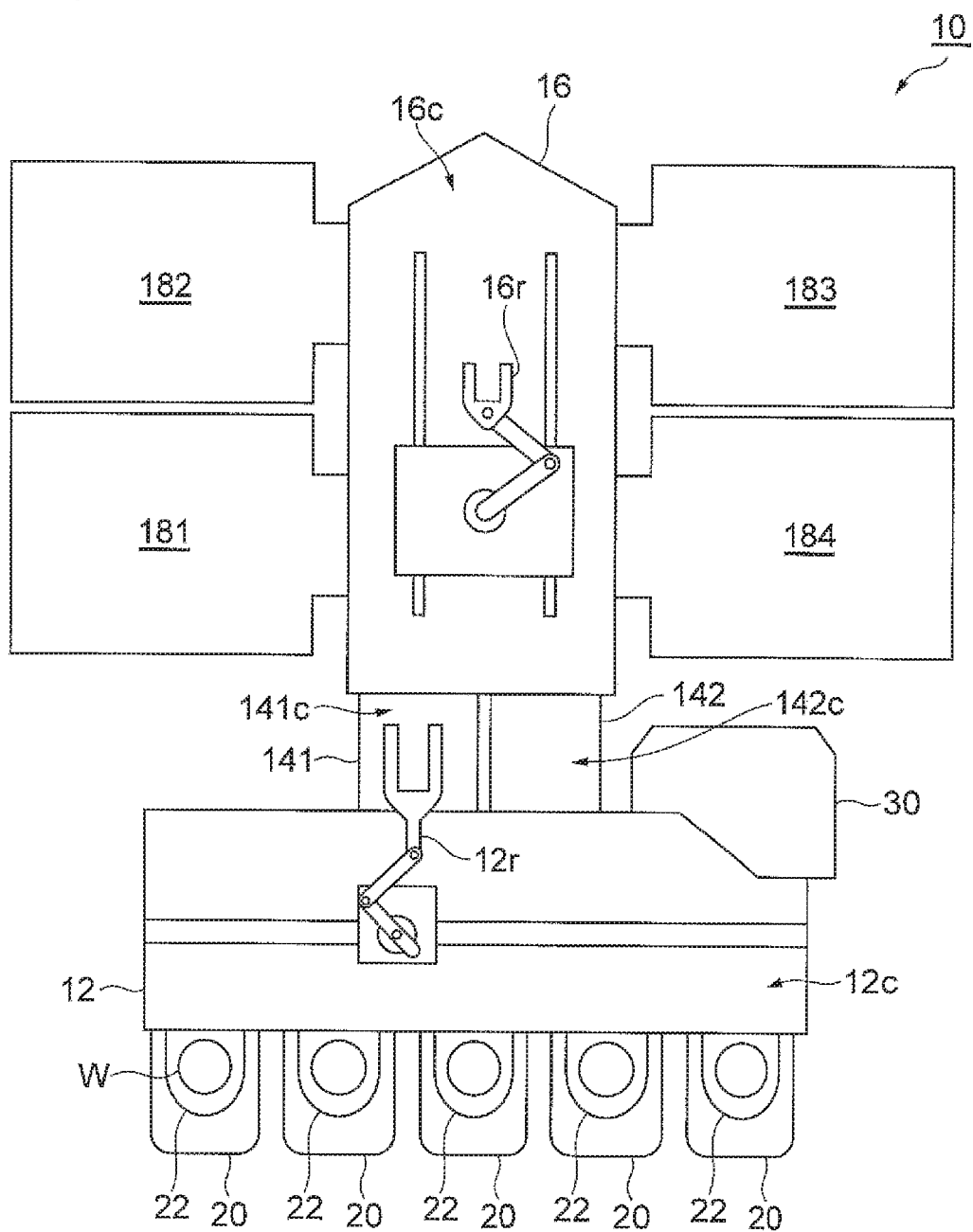
FIG. 1 is a view schematically illustrating a substrate processing system according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

In processing in a process module, adhered matters are formed on a substrate. If the substrate is returned to a FOUP in a state where the adhered matters are not completely removed, the FOUP, other substrates disposed in the FOUP, a measurement instrument, or the like become contaminated. Accordingly, it is necessary to remove the adhered matters on the substrate. Therefore, a storage unit may be attached to a loader module. The storage unit is configured to store a plurality of substrates to be stacked in a vertical direction. Gas (for example, air) is supplied from sides of the plurality of substrates in the storage unit to the plurality of substrates, reaction products are generated from the gas and the adhered matters, and the gas and the reaction products are discharged.

However, since a flow of the gas along the substrates in a conventional storage unit is nonuniform, much adhered matters remains on the substrates. Accordingly, in the storage unit, it is necessary to decrease nonuniformity in the flow of the gas along the substrates such that the adhered matters do not remain on the substrate.

In an aspect, there is provided a storage unit which stores a substrate for cleaning. That is, there is provided a storage unit which has a purge function. The storage unit includes a container, a rectifying plate, and an exhaust duct. The container is open to a front side, and provides a first space in which a plurality of substrates are to be stacked in a vertical direction, and a second space behind the first space. The rectifying plate is provided between the first space and the second space. The exhaust duct communicates with the second space. The rectifying plate has an effective region which faces the first space along a first direction, the first direction being orthogonal to the rectifying plate. The effective region includes a first region and a second region. The first region is a region which faces a center of the first space in a second direction orthogonal to the first direction and the vertical direction. That is, the first region is a region which faces the center of each of the plurality of substrates along the first direction. The second region extends on one side or both sides of the first region in the second direction. A plurality of through holes are formed in the first region to be distributed over the first region. The second region has a conductance which is lower than a conductance of the first region.

In the storage unit according to the aspect, since the exhaust duct is connected to the second space, the pressure of the second space is lower than the pressure of the first space. Accordingly, gas flows into the first space via the opening of the container. The gas flowing into the first space is supplied to each of the plurality of substrates stacked in the first space from the side of the substrates, and the gas flows along the plurality of substrates. Accordingly, adhered matters on the substrates are removed, and the removed matters pass through the through holes of the rectifying plate along with the gas toward the second space. The gas and removed matters reaching the second space are discharged via the exhaust duct.

If the plurality of substrates are stacked in the first space, the conductance at the center of the first space in the second direction (that is, width direction) is lower than the conductance of the first space on the side in the width direction with respect to the center. In order to decrease the difference in the conductance in the first space, the plurality of through holes are formed in the first region of the rectifying plate, that is, in the region facing the center of the first space along the first direction. In addition, the conductance of the second region of the rectifying plate, which extends on one side or both sides with respect to the first region, is lower than the conductance of the first region. In the storage unit according to the aspect, since such a rectifying plate is interposed between the first space and the second space, the difference in the conductance between paths of the gas, which reaches the second space from the first space via the rectifying plate, decreases. As a result, in the storage unit, nonuniformity in the flow of the gas flowing along each of the plurality of substrates decreases, and the adhered matters on the substrates are discharged.

In an embodiment, the second region is provided on the one side of the first region, and is provided to be closer to an opening of the exhaust duct of the second space side than the first region. According to this embodiment, the difference in the conductance between paths of the gas from the first space to the opening of the exhaust duct decreases. As a result, nonuniformity in the flow of the gas flowing along each of the plurality of substrates decreases, and the adhered matters of the substrates are discharged.

In an embodiment, the second region extends on the both sides of the first region in the second direction, and extends symmetrically in the second direction with respect to an opening of the exhaust duct of the second space side. According to the embodiment, the difference in the conductance between paths of the gas from the first space to the opening of the exhaust duct decreases. As a result, nonuniformity in the flow of the gas flowing along each of the plurality of substrates decreases, and the adhered matters on the substrates are discharged.

In an embodiment, the effective region includes a third region extending in the second direction on an upper side of the second region, and a plurality of through holes are formed in the third region to be distributed over the third region. According to this embodiment, in a case where the opening of the exhaust duct is closer to the lower portion of the rectifying plate than the upper portion (third region) thereof, the difference between the conductance in the path of the gas which reaches the opening of the exhaust duct from the first space via the third region of the rectifying plate and the conductance in the path of the gas which reaches the opening of the exhaust duct from the first space via the lower portion of the rectifying plate decreases.

In another aspect, there is provided a transfer apparatus. That is, a loader module configured to transfer a substrate under an atmospheric pressure environment is provided. The transfer apparatus includes a chamber body, a transfer robot, and any one of the above-described storage units, and a blower. The chamber body provides a transfer chamber. The transfer robot is provided in the transfer chamber. The storage unit is connected to the chamber body, the first space communicating with the transfer chamber. The blower is configured to generate a flow of gas toward the transfer chamber and the first space.

In still another aspect, there is provided a substrate processing system. The substrate processing system includes the above-described transfer apparatus, a load lock module, a transfer module, and a process module. The load lock module provides a preliminary depressurized chamber, and is connected to the chamber body of the transfer apparatus. The transfer module provides a depressurizable transfer chamber, includes the transfer robot in the transfer chamber, and is connected to the load lock module. The process module is a module for processing a substrate, and is connected to the transfer module.

As described above, it is possible to decrease nonuniformity in the flow of the gas along the substrates stored in the storage unit and to discharge the adhered matters on the substrates.

Hereinafter, various exemplary embodiments will be described in detail with reference to the drawings. In the drawings, the same reference symbols will be given to the same or equivalent portions.

FIG. 1 is a view schematically illustrating a substrate processing system according to an exemplary embodiment. A substrate processing system 10 shown in FIG. 1 includes a loader module 12, a load lock module 141, a load lock module 142, a transfer module 16, and a plurality of process modules 181 to 184.

The loader module 12 is a transfer apparatus of one embodiment, and is configured to transfer a substrate under an atmospheric pressure environment. A plurality of pedestals 20 are attached to the loader module 12. A FOUP 22 which accommodates a plurality of substrates (hereinafter, the substrate is referred, to a "wafer W") therein is mounted on each of the plurality of pedestals 20.

The loader module 12 includes a transfer robot 12r in a transfer chamber 12c inside the loader module 12. The load lock module 141 and the load lock module 142 are connected to the loader module 12. The transfer robot 12r transfers the wafer W between the FOUP 22 and the load lock module 141 or between the FOUP 22 and the load lock module 142. In addition, the transfer robot 12r also transfers the wafer W to a storage unit 30 described below. It should be noted that, when the wafer W is transferred from the FOUP 22 to the load lock modules 141 and 142, the wafer is transferred to the load lock modules 141 and 142 after the wafer is aligned by a wafer aligner (not shown).

The load lock module 141 and the load lock module 142 provide a chamber 141c and a chamber 142c for preliminary depressurization, respectively. The transfer module 16 is connected to the load lock module 141 and the load lock module 142. The transfer module 16 provides a depressurizable transfer chamber 16c, and has a transfer robot 16r in the transfer chamber 16c. The plurality of process modules 181 to 184 are connected to the transfer module 16. The transfer robot 16r of the transfer module 16 transfers the wafer W between any one of the load lock module 141 and the load lock module 142 and any one of the plurality of process modules 181 to 184, and between any two process modules of the plurality of process modules 181 to 184.

Each of the plurality of process modules 181 to 184 is a substrate processing device for performing dedicated processing with respect to the wafer W. For example, the processing which is performed by the process modules 181 to 184 is any processing such as plasma etching, film forming, or heat treatment.

Figure 2:
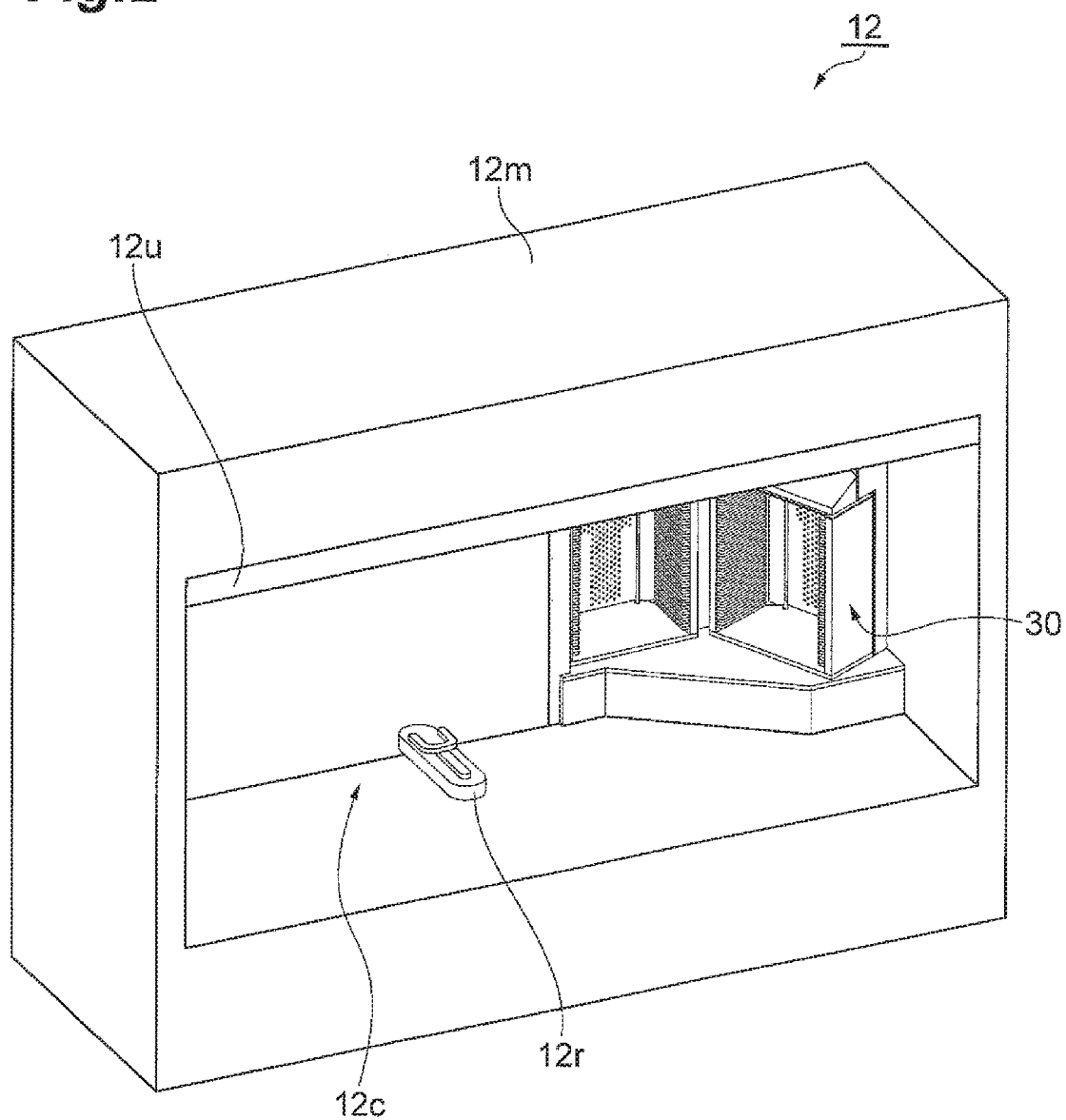
FIG. 2 is a perspective view illustrating a transfer apparatus according to an exemplary embodiment.
Figure 3:
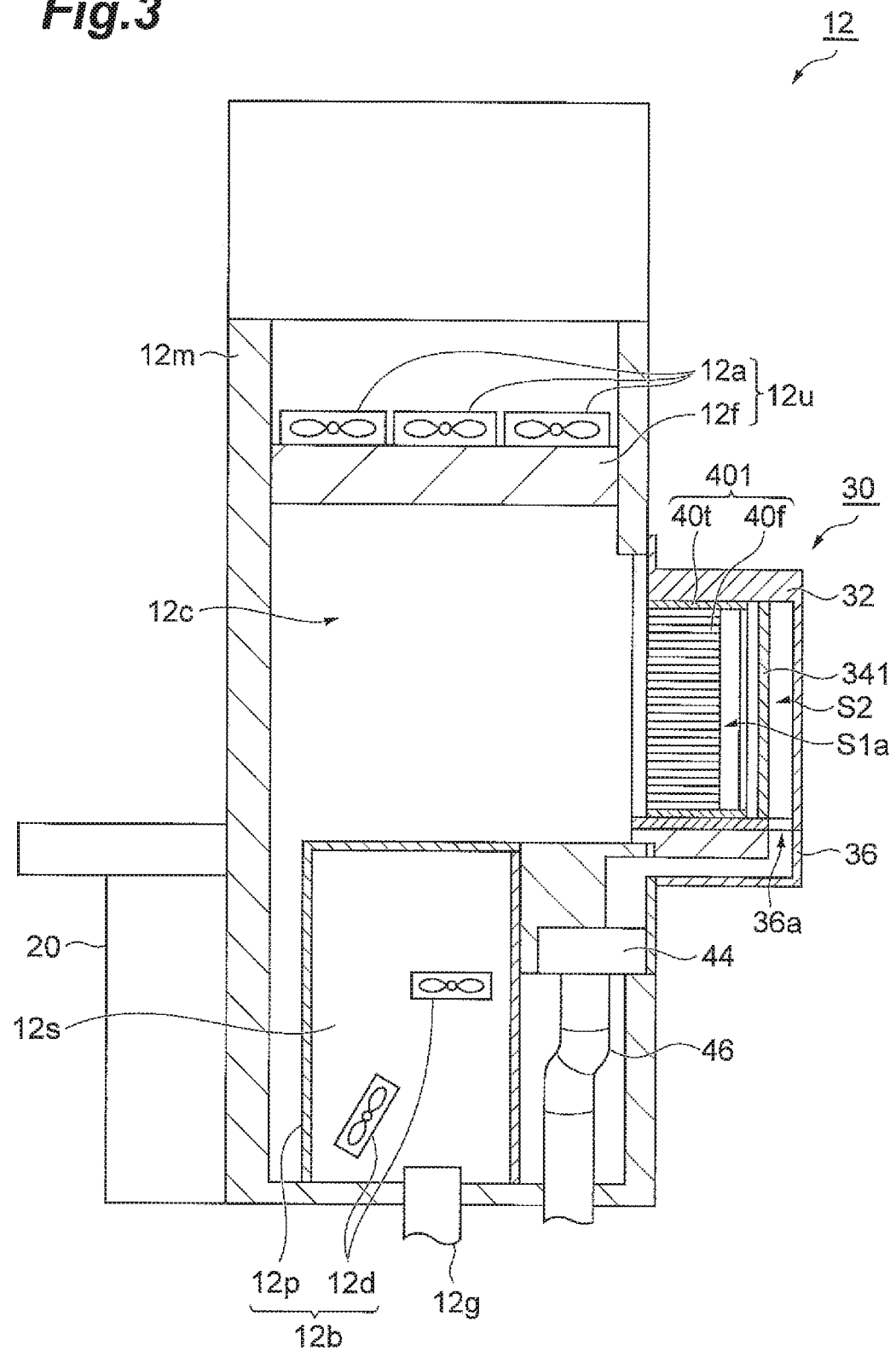
FIG. 3 is a view illustrating a partially broken view of the transfer apparatus according to the exemplary embodiment

Hereinafter, the loader module 12, which is the transfer apparatus of the substrate processing system 10, will be described in detail. FIG. 2 is a perspective view illustrating the transfer apparatus according to an exemplary embodiment, and FIG. 3 is a partially broken view of the transfer device according to the exemplary embodiment. As shown in FIGS. 2 and 3, the loader module 12 includes a chamber body 12m, the transfer robot 12r, and the storage unit 30.

The chamber body 12m is formed in an approximately box shape, and provides a transfer chamber 12c which is an internal space thereof. The transfer chamber 12c is a space for transferring the wafer W under an atmospheric pressure environment, and the transfer robot 12r is provided, in the transfer chamber 12c.

The loader module 12 further includes an upper fan filter unit 12u. The upper fan filter unit 12u is provided on the upper portion of the transfer chamber 12c. The upper fan filter unit 12u includes blowers 12a which are blower fans, and a filter 12f. The blowers 12a form a flow (downward flow) of gas (for example, clean air) toward the lower portion of the transfer chamber 12c via the filter 12f. The gas supplied from the blower 12a to the transfer chamber 12c is supplied to the storage unit 30. The space inside the transfer chamber 12c is controlled to be a positive pressure such that the adhered matters in the storage unit 30 do not reversely flow into the space inside the transfer chamber 12c.

In addition, the loader module 12 includes a lower fan filter unit 12b. The lower fan filter unit 12b is provided on the lower portion of the transfer chamber 12c. The lower fan filter unit 12b includes a rectifying plate 12p and fans 12d. A plurality of through holes are formed on the rectifying plate 12p. The fans 12d are provided inside a space 12s which is surrounded by the rectifying plate 12p. In the loader module 12, while the gas supplied from the upper fan filter unit 12u to the transfer chamber 12c is directed into the storage unit 30, the gas is pulled into the space 12s via the rectifying plate 12p by the fans 12d. The gas pulled into the space 12s is discharged to the outside of the loader module 12 via, a duct 12g which is connected to the space 12s.

Figure 4:
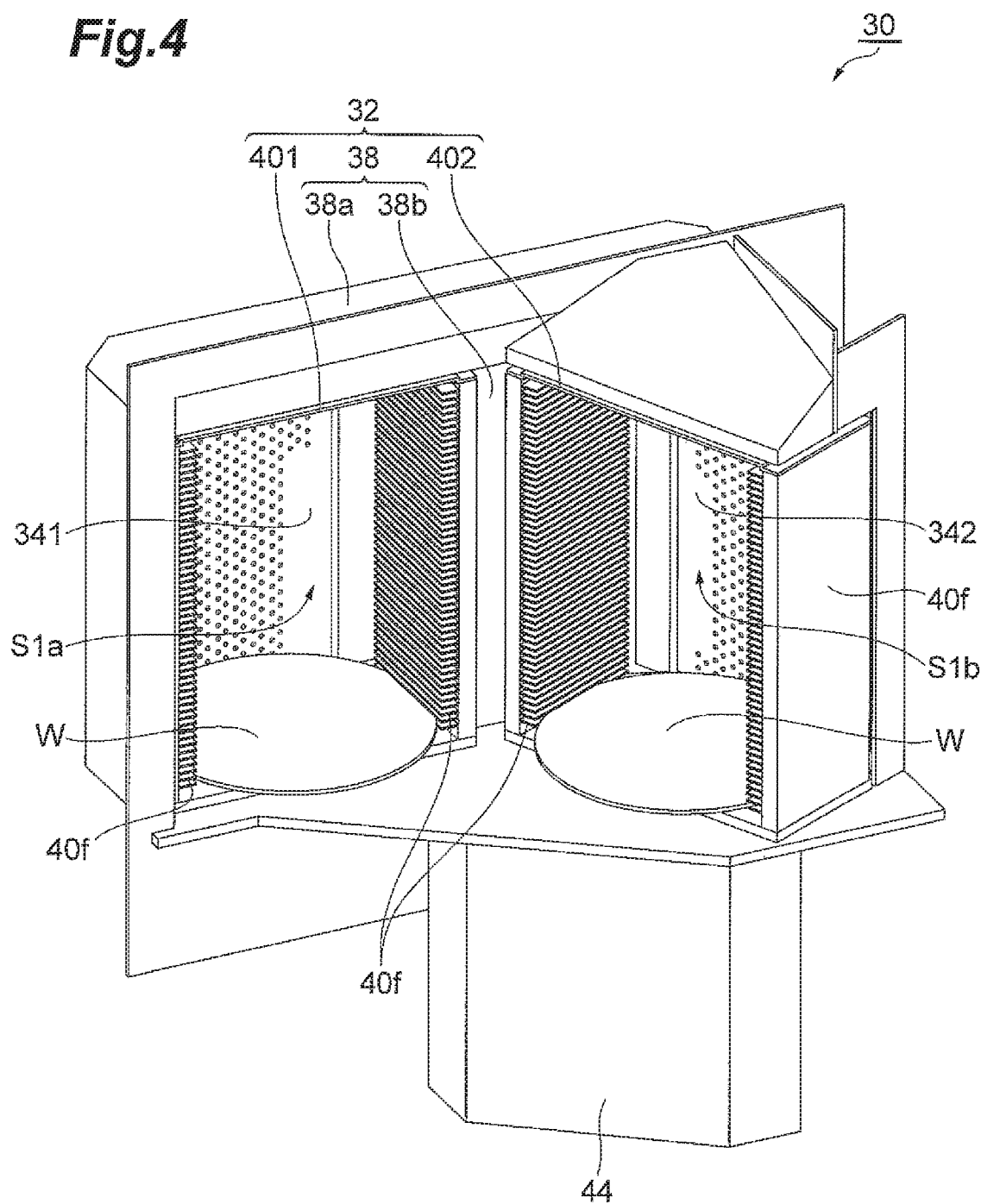
FIG. 4 is a perspective view illustrating a storage unit according to an exemplary embodiment.
Figure 5:
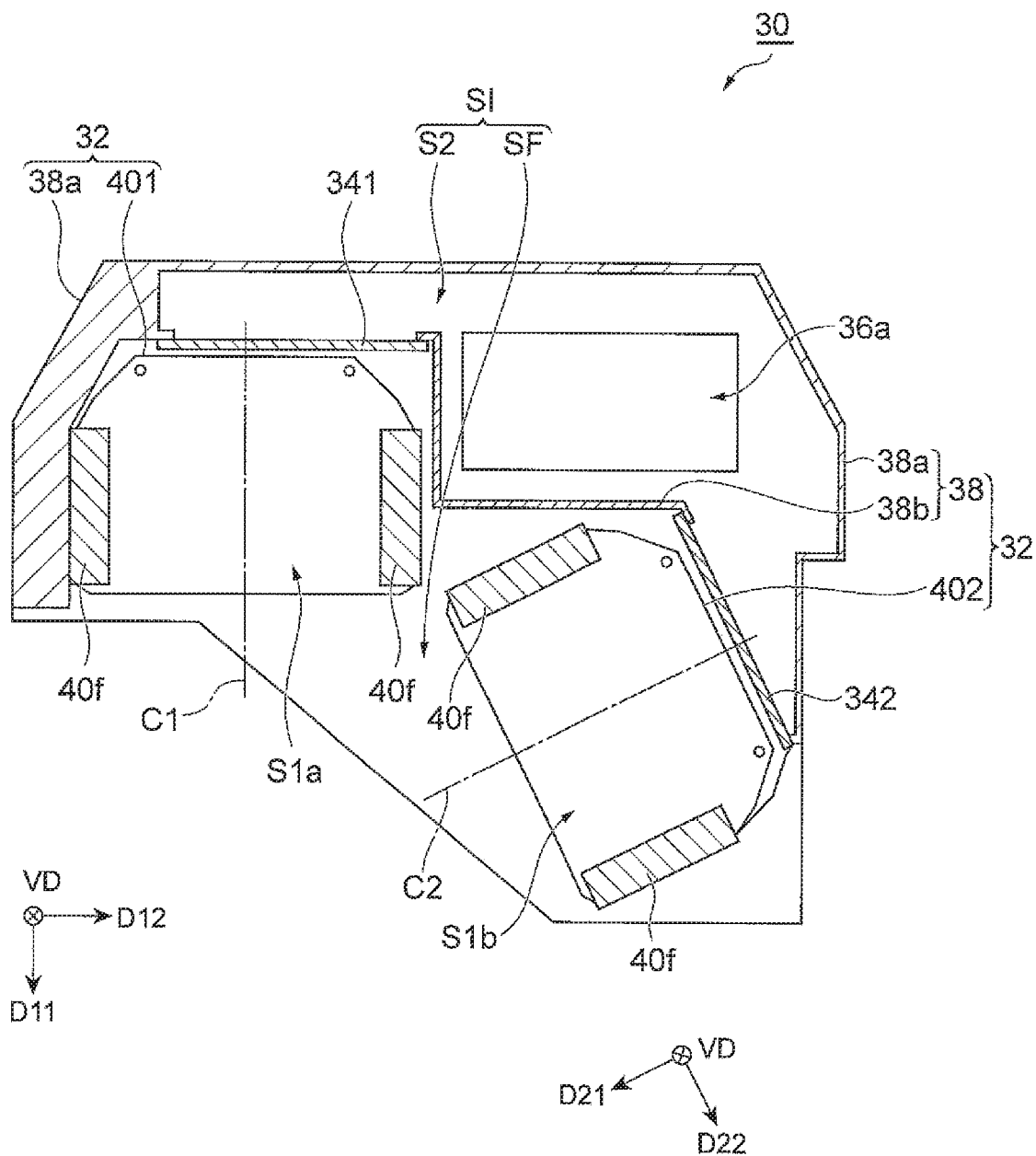
FIG. 5 is a sectional view illustrating the storage unit according the exemplary embodiment.

The storage unit 30 is connected to the chamber body 12m. FIG. 4 is a perspective view illustrating a storage unit according to an exemplary embodiment, and FIG. 5 is a sectional view illustrating the storage unit according to the exemplary embodiment. FIG. 5 shows a cross section of the storage unit at an intermediate position in a height direction of the storage unit. Hereafter, reference will be made to FIGS. 4 and 5 in addition to FIG. 3.

The storage unit 30 is configured to store the plurality of wafers W such that the wafers W are stacked in the vertical direction. The storage unit 30 is configured to form flow of gas along the plurality of wafers W to clean the plurality of wafers W. For example, the storage unit 30 is configured to discharge the adhered matters on the wafers W along with the gas, as they are, as combined matters between the adhered matters and water in the gas, or as reaction products between the adhered matters and the water in the gas. That is, the storage unit 30 has a purge function.

The storage unit 30 includes a container 32, two rectifying plates 341 and 342, and an exhaust duct 36. The container 32 includes a container body 38 and two supports 401 and 402. The container body 38 includes an outer wall 38a and a partition wall 38b. The outer wall 38a provides an internal space SI which is opened at a front side thereof. A front end of the outer wall 38a is connected to the chamber body 12m of the loader module 12. Accordingly, the transfer chamber 12c inside the chamber body 12m of the loader module 12 and the internal space SI communicate with each other.

The partition wall 38b is interposed between the rectifying plate 341 and the rectifying plate 342. The partition wall 38b, the rectifying plate 341, and the rectifying plate 342 divide the internal space SI into an front space SF and a second space S2 which extends behind the front space SF.

Figure 6:
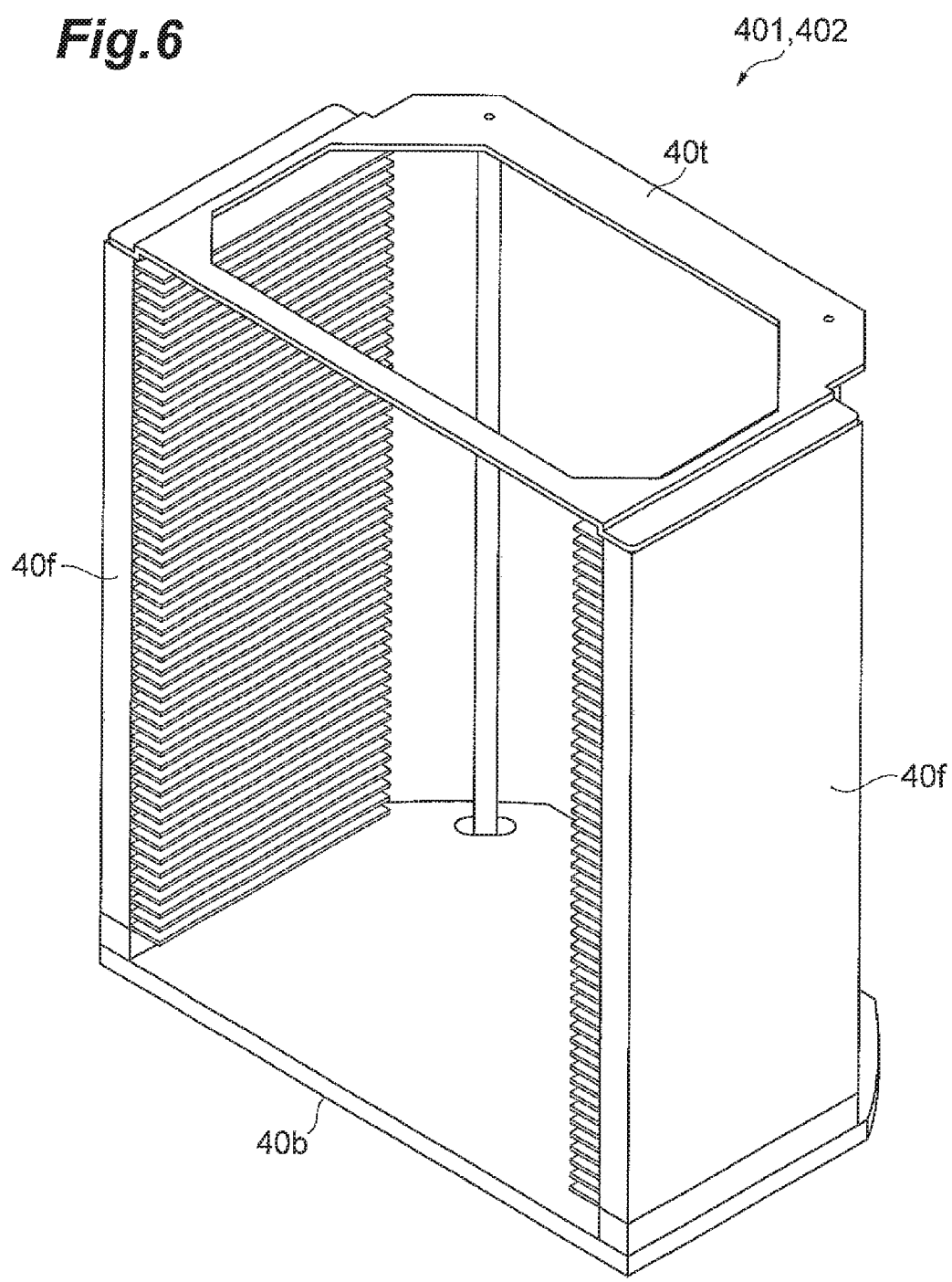
FIG. 6 is a perspective view illustrating a support.

The two supports 401 and 402 are provided in the front space SF. FIG. 6 is a perspective view illustrating a support. Hereinafter, reference is made to FIG. 6 in addition to FIGS. 3 to 5. The two supports 401 and 402 are configured to support the plurality of wafers W such that the wafers W are stacked in the vertical direction. The two supports 401 and 402 define first spaces S1a and S1b in the front space SF, respectively. Hereinafter, as reference symbols indicating directions related to the support 401 and the first space S1a, a direction VD, a direction D11, and a direction D12 are used. The direction VD is a vertical direction. The direction D11 is a first direction orthogonal to the rectifying plate 341. The direction D12 is a second direction orthogonal to the direction VD and the direction D11, and is a width direction of the first space S1a. Moreover, as reference symbols indicating directions related to the support 402 and the first space S1b, a direction VD, a direction D21, and a direction D22 are used. The direction D21 is a first direction orthogonal to the rectifying plate 342. The direction D22 is a second direction orthogonal to the direction VD and the direction D21, and is a width direction of the first space S1b.

As shown in FIG. 6, each of the supports 401 and 402 includes a bottom plate 40b, an upper frame 40t, and a pair of side members 40f. The pair of side members 40f is supported on the bottom plate 40b on both sides in the width direction, in addition, the upper ends of the pair of side members 40f are supported by the upper frame 40t.

The pair of side members 40f of the support 401 defines the above-described first space S1a from both sides in the direction D12 (width direction). In addition, the pair of side members 40f of the support 402 defines the above-described first space S1b from both sides in the direction D22 (width direction). Each of the first space S1a and the first space S1b is a space for storing the plurality of wafers W such that the wafers W are stacked in the vertical direction, and is opened toward the front side, that is, toward the transfer chamber 12c to communicate with the transfer chamber 12c. Accordingly, the gas from the blowers 12a is supplied to the first space S1a and the first space S1b via the openings.

Each of the pair of side members 40f includes a base portion having a plate shape, on the outside in the width direction. In addition, each of the pair of side members 40f includes a plurality of thin plate portions which protrude from the base portion toward the inside in the width direction. The plurality of thin plate portions are arranged in the vertical direction. The plurality of thin plate portions of the pair of side members 40f provide a plurality of slots in which the plurality of wafers W are stored such that the wafers W are stacked in the vertical direction.

Figure 8:
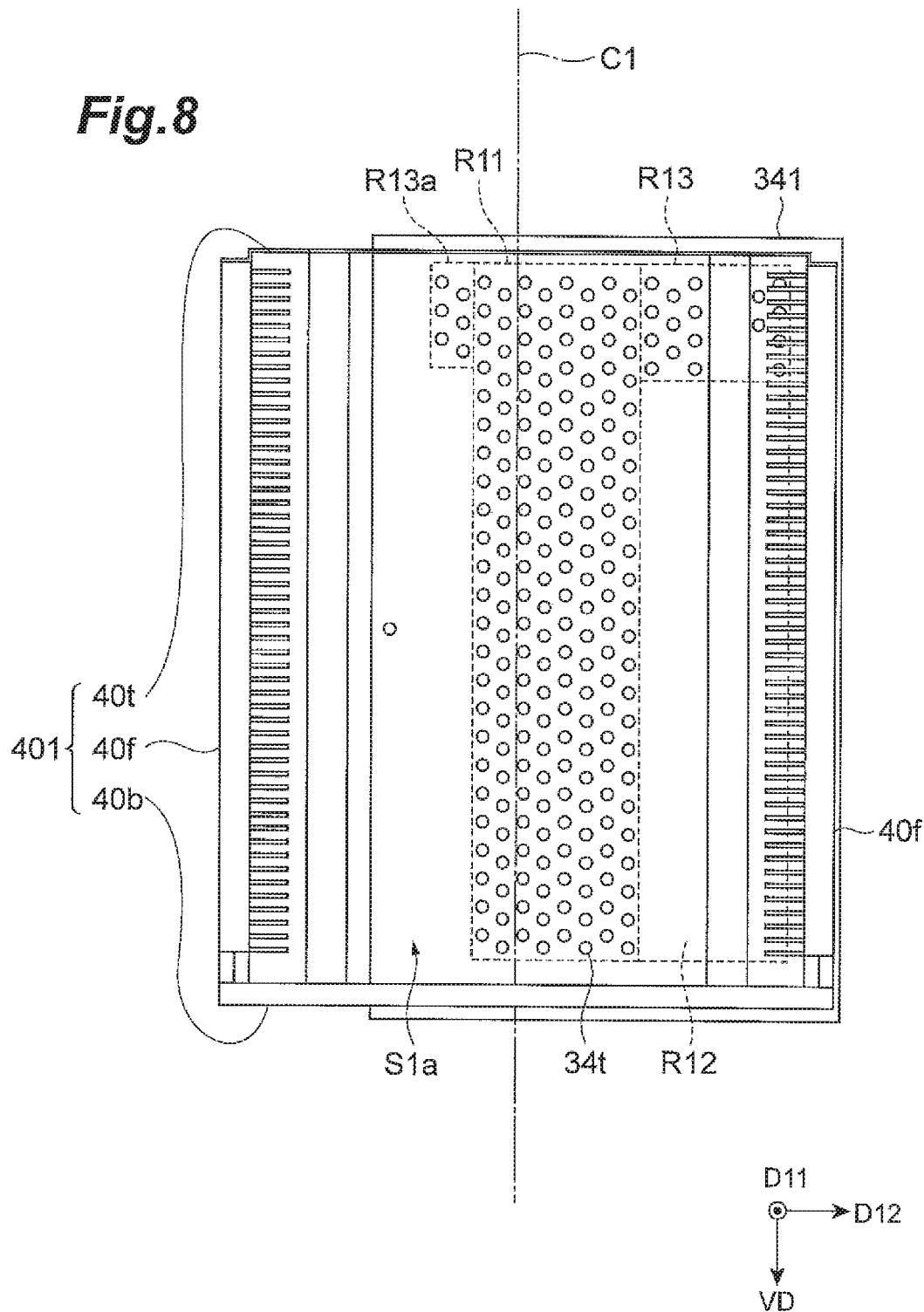
FIG. 8 is a plan view illustrating the rectifying plate and the support.

The rectifying plate 341 is provided between the first space S1a and the second space S2. FIG. 7 is a plan view illustrating a rectifying plate. FIG. 8 is a plan view illustrating the rectifying plate and the support. The rectifying plate 341 is a member having a plate shape which has an approximately rectangular plane shape. One main surface of the rectifying plate 341 faces the first space S1a side, and another main surface thereof faces the second space S2 side.

The rectifying plate 341 includes an effective region RE1. The effective region RE1 is a region which faces the first space S1a along the direction D11 and is interposed between the first space S1a and the second space S2. The rectifying plate 341 further includes an edge region around the effective region RE1. The edge region is a region which is supported by the container body 38 and is not related to the flow of gas between the first space S1a and the second space S2.

The effective region RE1 includes a first region R11 and a second region R12. In one embodiment, the effective region RE1 may further include a third region R13. The first region R11 has a band shape, and faces a center C1 of the first space S1a in the direction D12 (width direction), along the direction D11. That is, the first region R11 is a region having a band shape which faces the center of each of the plurality of wafers W which are stacked in the first space S1a. In the first region R11, a plurality of through holes 34t are formed to be distributed over the entire first region R11.

The second region R12 is an approximately rectangular region, and extends on one side of the first region R11 in the direction D12. The second region R12 faces a marginal region of the first space S1a in the direction D12. In the present embodiment, the second region R12 is provided on a side closer to the opening 36a of the exhaust duct 36 than the first region R11. The opening 36a of the exhaust duct 36 is located on the second space S2 side. The second region R12 has a conductance which is lower than a conductance of the first region R11. For example, in order to provide such a conductance to the second region R12, through holes are not formed in the second region R12.

The third region R13 extends on an upper side of the second region R12. The plurality of through holes 34t are also formed in the third region R13 to be distributed over the entire third region R13.

The effective region RE1 of the rectifying plate 341 may further include another second region R12a and another third region R13a. The second region R12a extends on the other side of the first region R11 in the direction D12. Similarly to the second region R12, the second region R12a has a conductance which is lower than the conductance of the first region R11. Moreover, the second region R12a has a width narrower than that of the second region R12. The third region R13a extends on an upper side of the second region R12a. The plurality of through holes 34t are formed in the third region R13a.

Figure 10:
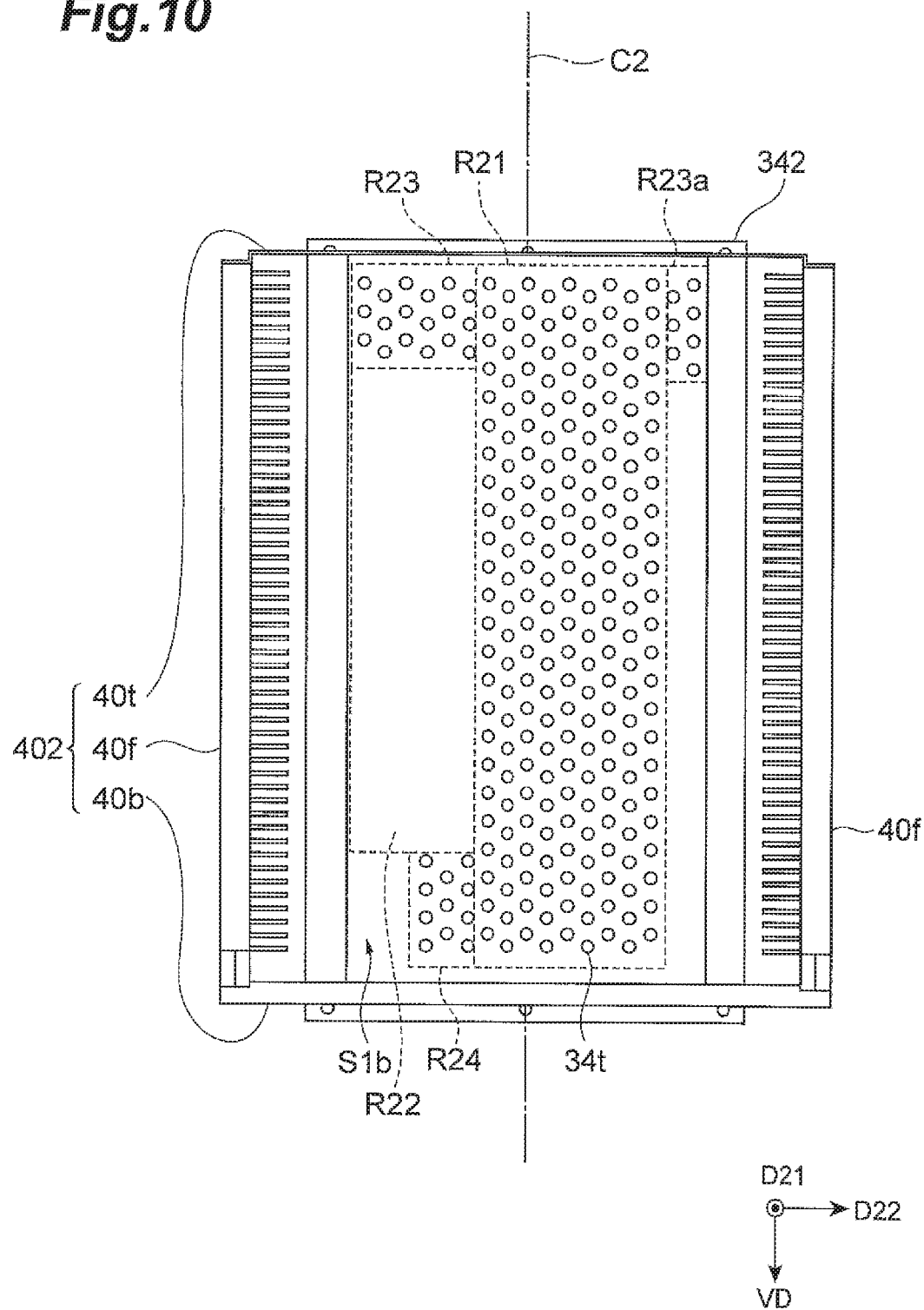
FIG. 10 is a plan view illustrating the rectifying plate and the support.

The rectifying plate 342 is provided between the first space S1b and the second space S2. FIG. 9 is a plan view illustrating a rectifying plate. FIG. 10 is a plan view illustrating the rectifying plate and the support. The rectifying plate 342 is a member having an approximately rectangular plate shape. One main surface of the rectifying plate 342 faces the first space S1b side, and another main surface thereof faces the second space S2 side.

The rectifying plate 342 includes an effective region RE2. The effective region RE2 is a region which faces the first space S1b and is interposed between the first space S1b and the second space S2. The rectifying plate 342 further includes an edge region around the effective region RE2. The edge region is a region which is supported by the container body 38, and is not related to the flow of gas between the first space S1b and the second space S2.

The effective region RE2 includes a first region R21 and a second region R22. In one embodiment, the effective region RE2 may further include a third region R23. The first region R21 has a band shape, and faces a center C2 of the first space S1b in the direction D22 (width direction), along the direction D21. That is, the first region R21 is a region having a band shape which faces the center of each of the plurality of wafers W which are stored in the first space S1b to be stacked. In the first region R21, the plurality of through holes 34t are formed to be distributed over the entire first region R21.

The second region R22 is an approximately rectangular region, and extends on one side of the first region R21 in the direction D22. The second region R22 faces a marginal region of the first space S1b in the direction D22. In the present embodiment, the second region R22 is provided on a side closer to the opening 36a of the second space S2 side of the exhaust duct 36 than the first region R21. The second region R22 has a conductance which is lower than a conductance of the first region R21. For example, in order to provide such a conductance to the second region R22, through holes are not formed in the second region R22.

The third region R23 extends on an upper side of the second region R22. The plurality of through holes 34t are also formed in the third region R23 to be distributed over the entire third region R23.

The effective region RE2 of the rectifying plate 342 may further include a region R24 below the second region R22. The plurality of through holes 34t are formed in the region R24. The effective region RE2 of the rectifying plate 342 may further include another second region R22a and another third region R23a. The second region R22a extends on the other side of the first region R21 in the direction D22. Similarly to the second region R22, the second region R22a has a conductance Which is lower than the conductance of the first region R21. Moreover, the second region R22a has a width narrower than that of the second region R22. The third region R23a extends on an upper side of the second region R22a. The plurality of through holes 34t are formed in the third region R23a.

Referring to FIGS. 3 to 5 again, the exhaust duct 36 is connected to the container 32. The exhaust duct 36 communicates with the second space S2, and provides an opening 36a (opening of the second space S2 side) below the second space S2. An exhaust box 44 is connected to a downstream side of the exhaust duct 36. A check valve and a flow regulating valve are provided in the exhaust box 44. Another exhaust duct 46 is connected to a downstream side of the exhaust box 44. The exhaust duct 46 is a pipe through which the gas and the reaction products are discharged from the second space S2 to the outside of the loader module 12.

In the storage unit 30, since the exhaust duct 36 is connected to the second space S2, the pressure of the second space S2 is lower than the pressures of the first spaces S1a and S1b. Accordingly, gas flows into the first spaces S1a and S1b via the opening of the container 32. The gas flowing into the first spaces S1a and S1b is supplied to the plurality of wafers W stacked in the first spaces S1a and S1b from the sides of the wafers, and the gas flows along the plurality of wafers W. Accordingly, the adhered matters on the wafers W are removed. The removed matters are discharged to the second space S2 through the through holes of the rectifying plates 341 and 342 along with the gas, as they are, as combined matters between the adhered matters and water in the gas, or as reaction products between the adhered matters and the water in the gas. The gas and the reaction products reaching the second space S2 are discharged via the exhaust duct 36.

If the plurality of wafers W are stacked in the first space S1a, the conductance at the center C1 of the first space S1a is lower than the conductance of the first space S1a on the sides in the width direction with respect to the center C1. In order to decrease the difference between conductances in the first space S1a, the plurality of through holes 34t are formed in the first region R11 of the rectifying plate 341. In addition, the conductance of the second region R12 of the rectifying plate 341 extending on the one side with respect to the first region R11 is lower than the conductance of the first region R11. Since such a rectifying plate 341 is interposed between the first space S1a and the second space S2, the difference in the conductance between paths of the gas, which reaches the second space S2 from the first space S1a via the rectifying plate 341, decreases. As a result, nonuniformity in the flow of the gas flowing along each of the plurality of wafers W stored in the first space S1a decreases, and the adhered matters are discharged. Accordingly, it is possible to discharge the adhered matters on the plurality of wafers W stored in the first space S1a.

In addition, if the plurality of wafers W are stacked in the first space S1b, the conductance at the center C2 of the first space S1b is lower than the conductance of the first space S1b on the sides in the width direction with respect to the center C2. In order to decrease the difference between conductances in the first space S1b, the plurality of through holes 34t are formed in the first region R21 of the rectifying plate 342. In addition, the conductance of the second region R22 of the rectifying plate 342 extending on the one side with respect to the first region R21 is lower than the conductance of the first region R21. Since such a rectifying plate 342 is interposed between the first space S1b and the second space S2, the difference in the conductance between paths of the gas, which reaches the second space S2 from the first space S1b via the rectifying plate 342, decreases. As a result, nonuniformity in the flow of the gas flowing along each of the plurality of wafers W stored in the first space S1b decreases. Accordingly, it is possible to discharge the adhered matters on the plurality of wafers W stored in the first space S1b.

In addition, the second R12 of the rectifying plate 341 is provided to be closer to the opening 36a of the exhaust duct 36 than the first region R11. Accordingly, the difference in the conductance between paths of the gas from the first space S1a to the opening 36a of the exhaust duct 36 decreases. In addition, the second region R22 of the rectifying plate 342 is provided to be closer to the opening 36a of the exhaust duct 36 relative to the first region R21. Accordingly, the difference in the conductance between paths of the gas from the first space S1b to the opening 36a of the exhaust duct 36 decreases.

In addition, the third region R13 of the rectifying plate 341 decreases the difference between the conductance of the path of the gas reaching the opening 36a of the exhaust duct 36 from the first space S1a via the upper portion of the rectifying plate 341, and the conductance of the path of the gas reaching the opening 36a of the exhaust duct 36 from the first space S1a via the lower portion of the rectifying plate 341. Moreover, the third region R23 of the rectifying plate 342 decreases the difference between the conductance of the path of the gas reaching the opening 36a of the exhaust duct 36 from the first space S1b via the upper portion of the rectifying plate 342, and the conductance of the path of the gas reaching the opening 36a of the exhaust duct 36 from the first space S1b via the lower portion of the rectifying plate 342.

Figure 11:
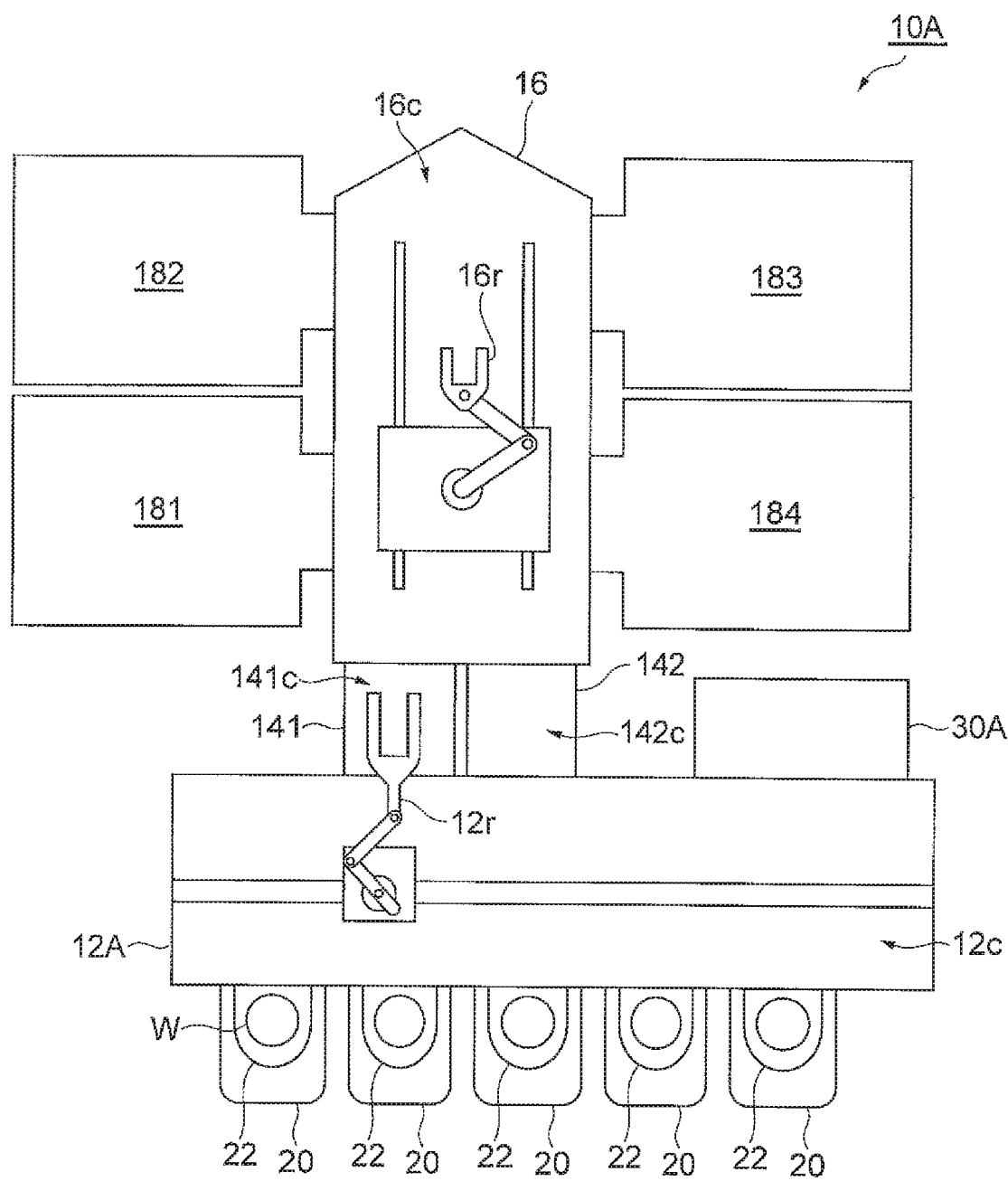
FIG. 11 is a view schematically illustrating a substrate processing system according to another exemplary embodiment.

Hereinafter, a substrate processing system according to another embodiment will be described. FIG. 11 is a view schematically illustrating a substrate processing system according to another exemplary embodiment. A substrate processing system 10A shown in FIG. 11 is different from the substrate processing system 10 in that a loader module 12A instead of the loader module 12. In addition, the loader module 12A is different from the loader module 12 in that a storage unit 30A is provided instead of the storage unit 30. Hereinafter, the storage unit 30A will be described.

Figure 12:
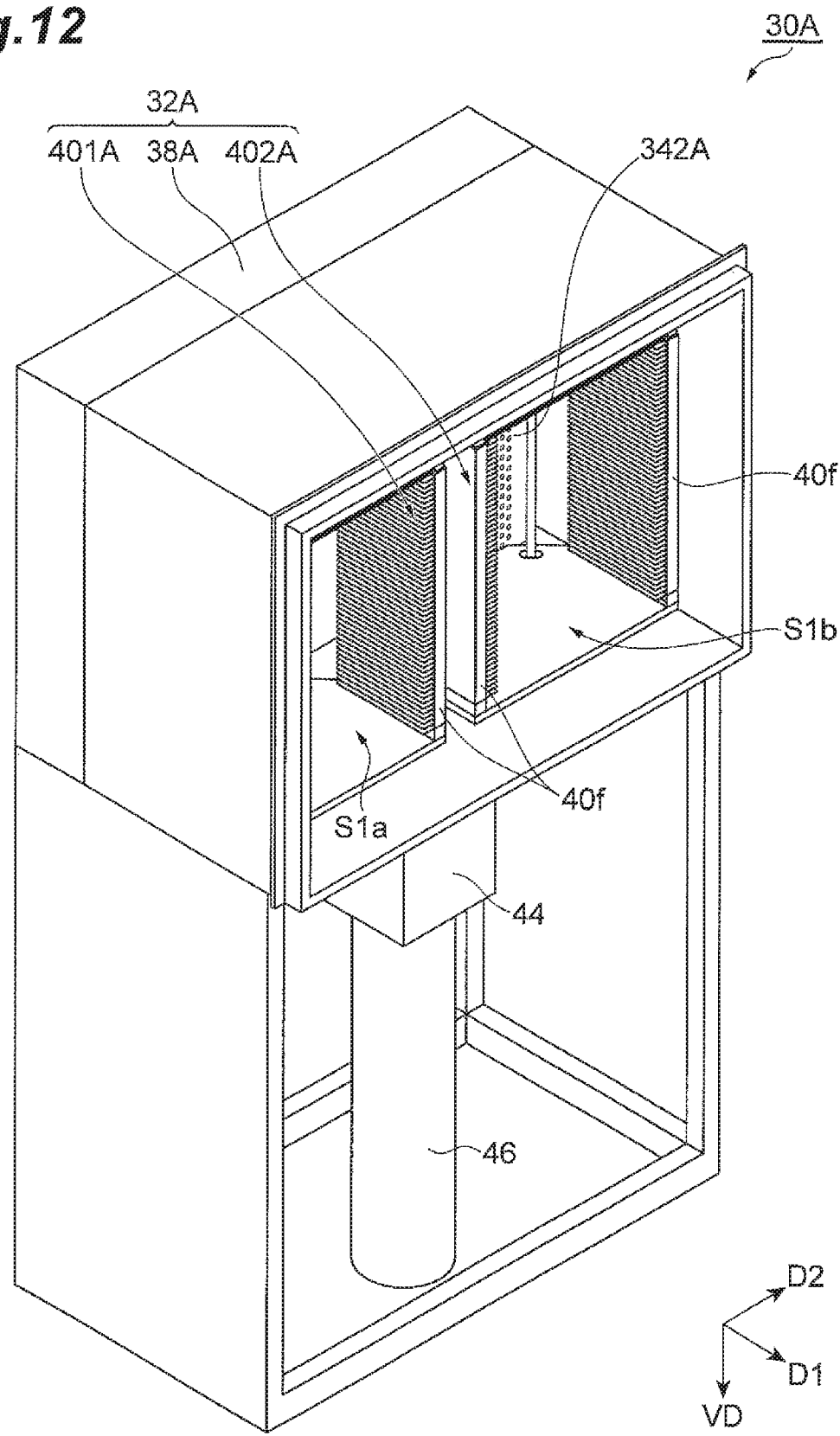
FIG. 12 is a perspective view illustrating a storage unit according to another exemplary embodiment.

FIG. 12 is a perspective view illustrating a storage unit according to another exemplary embodiment. FIG. 13 is a sectional view illustrating the storage unit according to another exemplary embodiment. The storage unit 30A shown in FIGS. 12 and 13 includes a container 32A, two rectifying plates 341A and 342A, and an exhaust duct 36A. The container 32A includes a container body 38A and two supports 401A and 402A. The container body 38A includes an outer wall 38Aa and partition walls 38Ab. The outer wall 38Aa has an approximately box shape, and provides an internal space SI which is opened at a front side thereof. The front end of the outer wall 38Aa is connected to the chamber body 12m of the loader module 12A. Accordingly, the transfer chamber 12c inside the chamber body 12m of the loader module 12A and the internal space SI communicate with each other.

The partition walls 38Ab are interposed between the outer wall 38Aa and the rectifying plate 341A, between the rectifying plate 341A and the rectifying plate 342A, and between the outer wall 38Aa and the rectifying plate 342A. The partition walls 38Ab, the rectifying plate 341A, and the rectifying plate 342A divide the internal space SI into a front space SF and a second space S2 which extends behind the front space SF.

The two supports 401A and 402A are provided in the front space SF. The two supports 401A and 402A define the first spaces S1*a* and S1*b* in the first space SF, respectively. The two supports 401A and 402A have the same configurations as those of the supports 401 and 402 shown in FIG. 6. However, the supports 401 and 402 are disposed such that the width directions thereof are not the same direction as each other and are directions which intersect each other. Meanwhile, the support 401A and the support 402A are disposed such that the width directions thereof are the same direction as each other. Hereinafter, a first direction orthogonal to the rectifying plate 341A and the rectifying plate 342A is referred to as a direction D1. In addition, a second direction orthogonal to the direction D1 and the vertical direction (direction VD), that is, a width direction of each of the first space S1*a* and the first spaces S1*b* is referred to as a direction D2.

Figure 14:
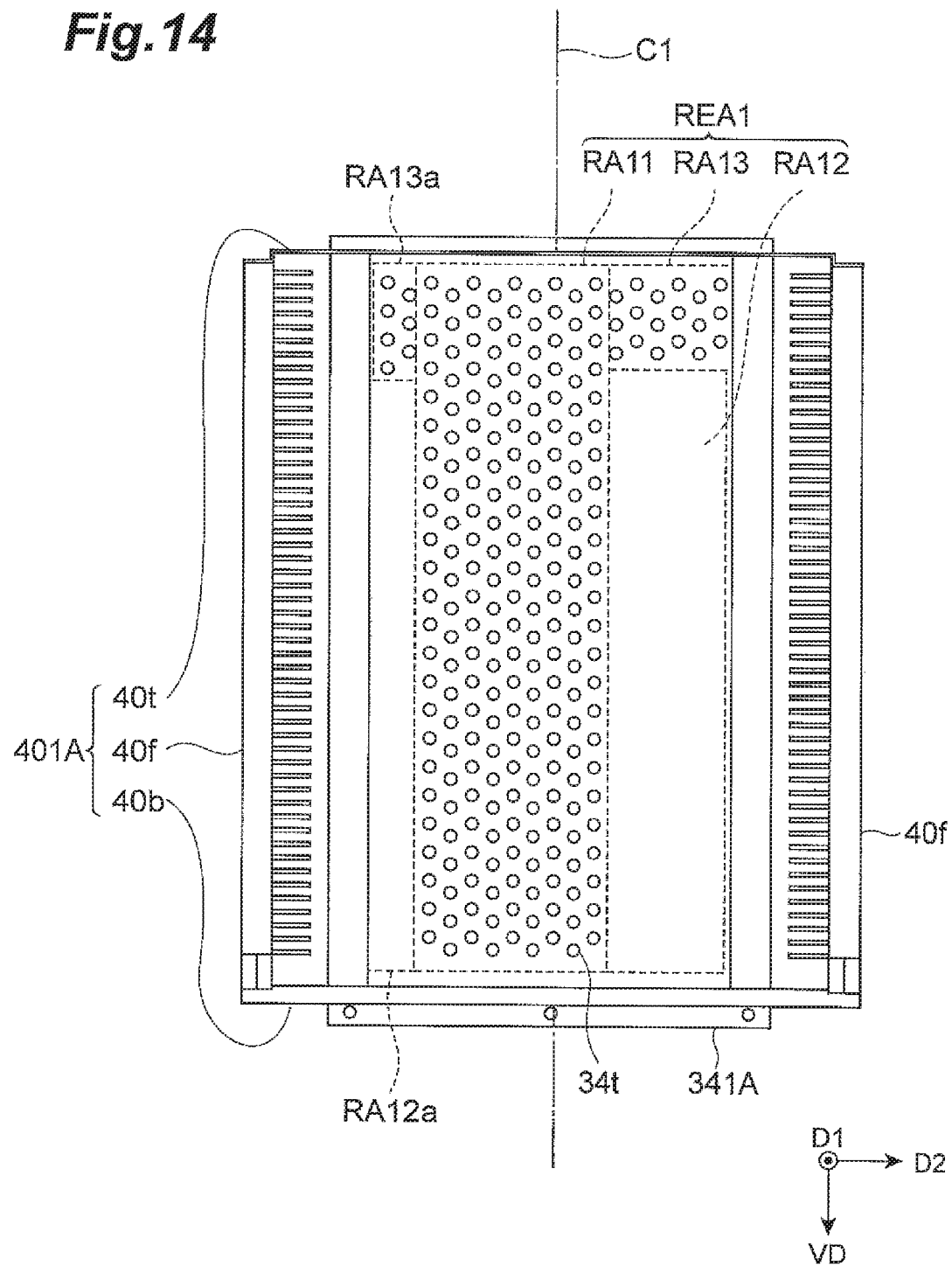
FIG. 14 is a plan view illustrating a rectifying plate and a support.

The rectifying plate 341A is provided between the first space S1*a* and the second space S2. FIG. 14 is a plan view showing a rectifying plate and a support. The rectifying plate 341A is a member having a plate shape which has an approximately rectangular plane shape. One main surface of the rectifying plate 341A faces the first space S1*a* side, and another main surface thereof faces the second space S2 side.

The rectifying plate 341A includes an effective region REA1. The effective region REA1 is a region which faces the first space S1*a* and is interposed between the first space S1*a* and the second space S2. The rectifying plate 341A further includes an edge region around the effective region REA1. The edge region is a region which is supported by the container body 38A and is not related to the flow of gas between the first space S1*a* and the second space S2.

The effective region REA1 includes a first region RA11 and a second region RA12. In one embodiment, the effective region REA1 may further include a third region RA13. The first region RA11 has a band shape, and faces a center C1 of the first space S1*a* in the direction D2 (width direction), along the direction D1. That is, the first region RA11 is a region having a band shape which faces the center of each of the plurality of wafers W which are stacked in the first space S1*a*. In the first region RA11, a plurality of through holes 34*t* are formed to be distributed over the entire first region RA11.

The second region RA12 is an approximately rectangular region, and extends on one side of the first region RA11 in the direction D2. The second region RA12 faces a marginal region of the first space S1*a* in the direction D2. In the present embodiment, the second region RA12 is provided on a side closer to an opening 36Aa of the second space S2 side of an exhaust duct 36A than the first region RA11. The second region RA12 has a conductance which is lower than conductance of the first region RA11. For example, in order to provide such a conductance to the second region RA12, through holes are not formed in the second region RA12.

The third region RA13 extends on an upper side of the second region RA12. The plurality of through holes 34*t* are also formed in the third region RA13 to be distributed over the entire third region RA13.

The effective region REA1 of the rectifying plate 341A may further include another second region RA12*a* and another third region RA13*a*. The second region RA12*a* extends on the other side of the first region RA11 in the direction D2. Similarly to the second region RA12, the second region RA12*a* has a conductance which is lower than the conductance of the first region RA1. Moreover, the second region RA12*a* has a width narrower than that of the second region RA12. The third region RA13*a* extends on an upper side of the second region RA12*a*. The plurality of through holes 34*t* are formed in the third region RA13*a*.

Figure 15:
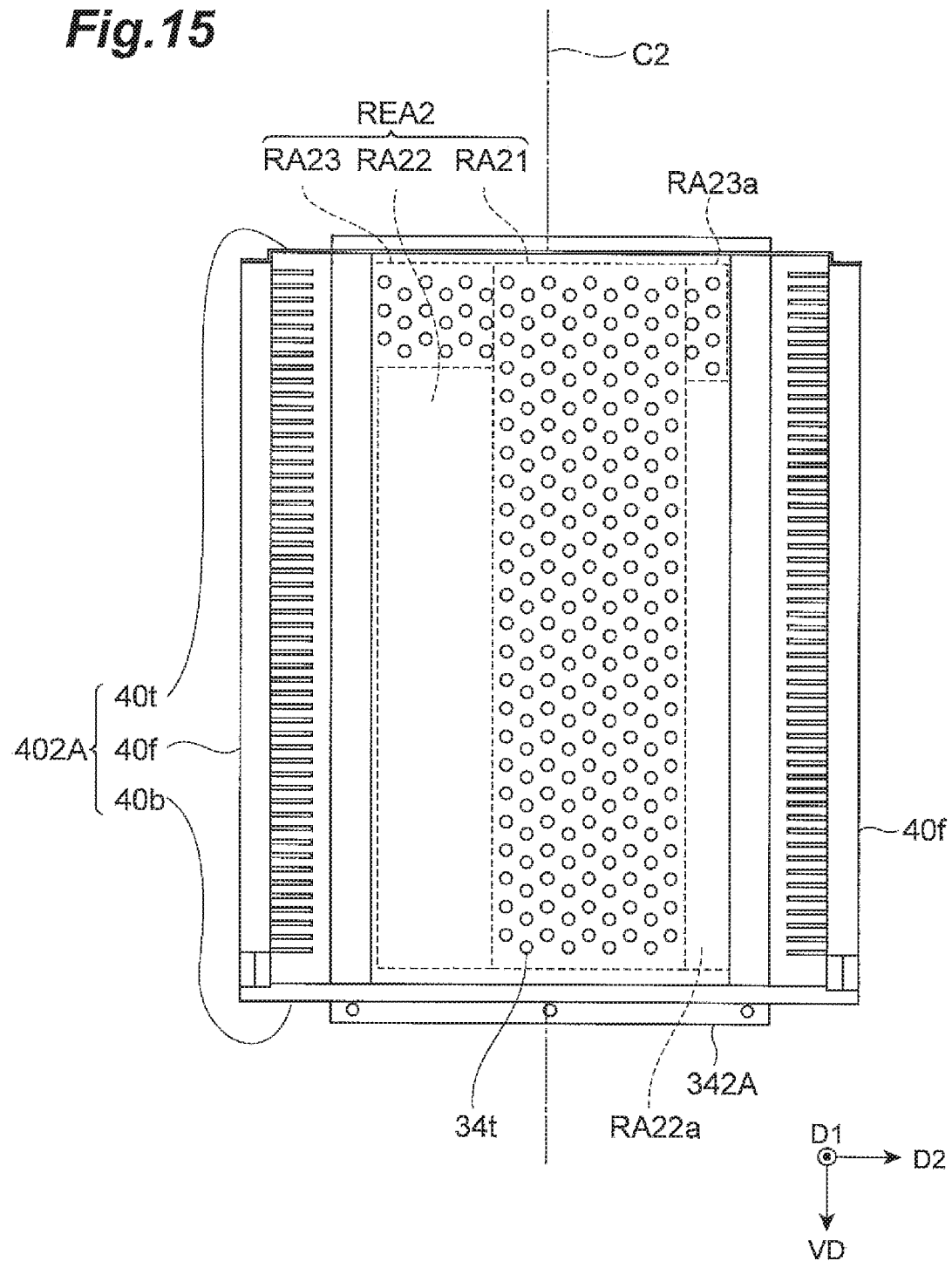
FIG. 15 is a plan view illustrating a rectifying plate and a support.

The rectifying plate 342A is provided between the first space S1*b* and the second space S2. FIG. 15 is a plan view illustrating a rectifying plate and a support. The rectifying plate 342A is a member having a plate shape which has an approximately rectangular plane shape. One main surface of the rectifying plate 342A faces the first space S1*b* side, and another main surface thereof faces the second space S2 side.

The rectifying plate 342A includes an effective region REA2. The effective region REA2 is a region which faces the first space S1*b* and is interposed between the first space S1*b* and the second space S2. The rectifying plate 342A further includes an edge region around the effective region REA2. The edge region is a region which is supported by the container body 38A and is not related to the flow of gas between the first space S1*b* and the second space S2.

The effective region REA2 includes a first region RA21 and a second region RA22. In one embodiment, the effective region REA2 may further include a third region RA23. The first region RA21 has a band shape which faces a center C2 in the direction D2 (width direction) of the first space S1*b*, along the direction D1. That is the first region RA21 is a region having a band shape which faces the center of each of the plurality of wafers W which are stacked in the first space S1*b*. In the first region RA21, a plurality of through holes 34*t* are formed to be distributed over the entire first region RA21.

The second region RA22 is an approximately rectangular region, and extends on one side of the first region RA21 in the direction D2. The second region RA22 is a region Which faces a marginal region of the first space S1*b* in the direction D2. In the present embodiment, the second region RA22 is provided on a side closer to an opening 36Aa of the second space S2 side of an exhaust duct 36A than the first region RA21. The second region RA22 has a conductance which is lower than a conductance of the first region RA21. For example, in order to provide such a conductance to the second region RA22, through holes are not formed in the second region RA22.

The third region RA23 extends on an upper side of the second region RA22. The plurality of through holes 34t are also formed in the third region RA23 to be distributed over the entire third region RA23.

The effective region REA2 of the rectifying plate 342A may further include another second region RA22a and another third region RA23a. The second region RA22a extends on the other side of the first region RA21 in the direction D2. Similarly to the second region RA22, the second region RA22a has a conductance which is lower than the conductance of the first region RA21. Moreover, the second region RA22a has a width narrower than that of the second region RA22. The third region RA23a extends on an upper side of the second region RA22a. The plurality of through holes 34t are formed in the third region RA23a.

Reference is made to FIGS. 12 and 13 again. Moreover, reference is made to FIG. 16, in addition to FIGS. 12 and 13. FIG. 16 is a sectional view showing the storage unit shown in FIG. 12, and shows a cross section in which the storage unit is sectioned along a plane which extends in the width direction and the vertical direction and passes through the second space.

The exhaust duct 36A is connected to the container 32A. The exhaust duct 36A communicates with the second space S2, and provides the opening 36Aa (opening of the second space S2 side) below the second space S2. The opening 36Aa is positioned below the center of the second space S2 in the direction D2. That is, the distance from the rectifying plate 341A to the opening 36Aa in the width direction is approximately the same as the distance from the rectifying plate 342A to the opening 36Aa in the width direction. The exhaust box 44 is connected to a downstream side of the exhaust duct 36A. In addition, another exhaust duct 46 is connected to a downstream side of the exhaust box 44.

In the storage unit 30A, since the rectifying plate 341A having the above-described first region RA11 and second region RA12 is interposed between the first space S1a and the second space S2, the difference in the conductance between paths of the gas, which reaches the second space S2 from the first space S1a via the rectifying plate 341A, decreases. As a result, nonuniformity in the flow of the gas flowing along each of the plurality of wafers W stored in the first space S1a decreases. Accordingly, it is possible to discharge the adhered matters on the plurality of wafers W stored in the first space S1a. In addition, since the rectifying plate 342A having the above-described first region RA21 and second region RA22 is interposed between the first space S1b and the second space S2, the difference in the conductance between paths of the gas, which reaches the second space S2 from the first space S1b via the rectifying plate 342A, decreases. As a result, nonuniformity in the flow of the gas flowing along each of the plurality of wafers W stored in the first space S1b decreases. Accordingly, it is possible to discharge the adhered matters on the plurality of wafers W stored in the first space S1b.

In addition, the second region RA12 of the rectifying plate 341A is provided to be closer to the opening 36Aa of the exhaust duct 36A than the first region RA11. Accordingly, the difference in the conductance between paths of the gas from the first space S1a to the opening 36Aa of the exhaust duct 36A decreases. In addition, the second region RA22 of the rectifying plate 342A is provided to be closer to the opening 36Aa of the exhaust duct 36A than the first region RA21. Accordingly, the difference in the conductance between paths of the gas from the first space S1b to the opening 36Aa of the exhaust duct 36A decreases.

In addition, the third region RA13 of the rectifying plate 341A decreases the difference between the conductance of the path of the gas reaching the opening 36Aa of the exhaust duct 36A from the first space S1a via the upper portion of the rectifying plate 341A, and the conductance of the path of the gas reaching the opening 36Aa of the exhaust duct 36A from the first space S1a via the lower portion of the rectifying plate 341A. Moreover, the third region RA23 of the rectifying plate 342A decreases the difference between the conductance of the path of the gas reaching the opening 36Aa of the exhaust duct 36A from the first space S1b via the upper portion of the rectifying plate 342A, and the conductance of the path of the gas reaching the opening 36Aa of the exhaust duct 36A from the first space S1b via the lower portion of the rectifying plate 342A.

Figure 17:
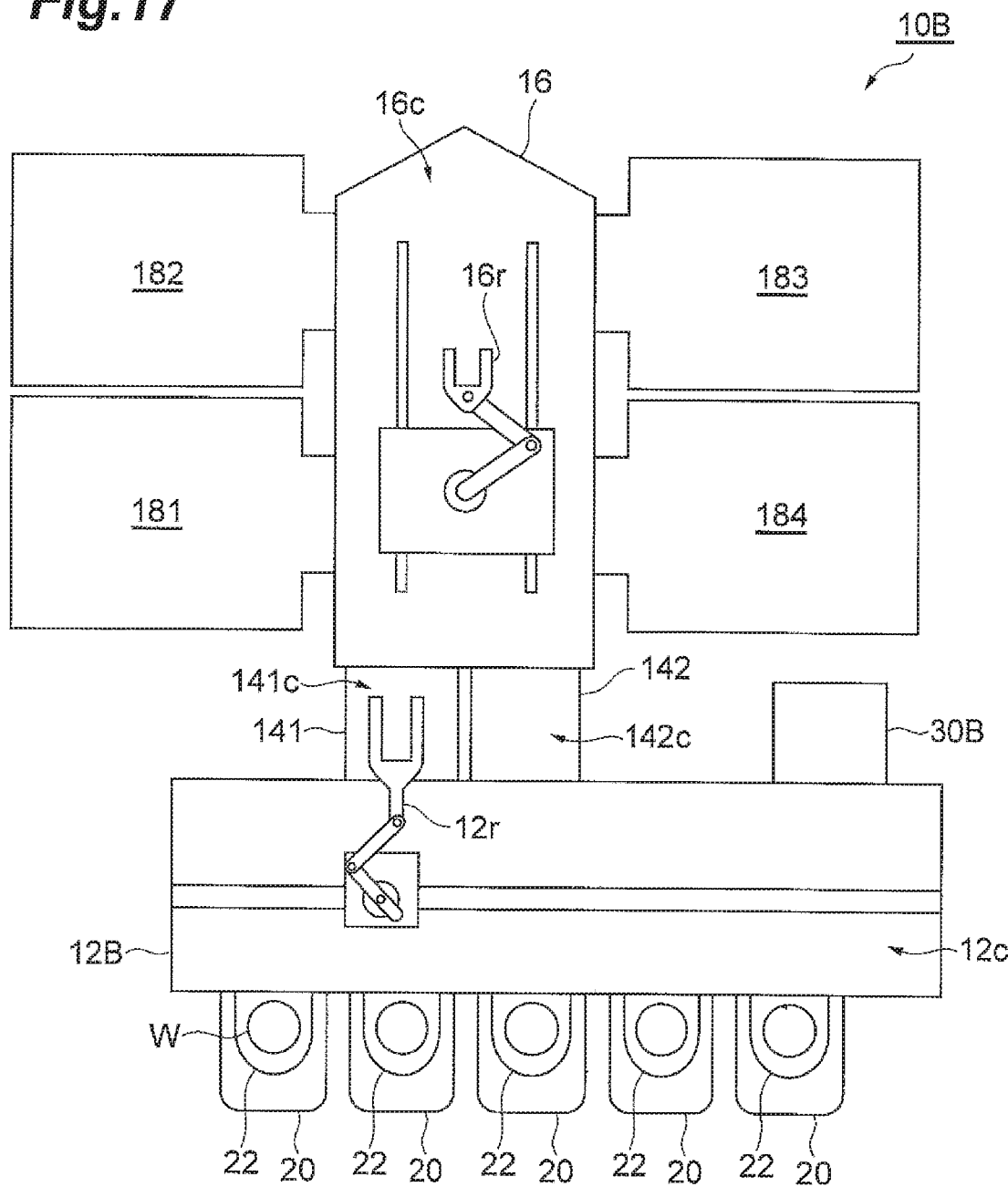
FIG. 17 is a view schematically illustrating a substrate processing system according to still another exemplary embodiment.

Hereinafter, a substrate processing system according to still another embodiment will be described. FIG. 17 is a view schematically illustrating a substrate processing system according to still another exemplary embodiment. A substrate processing system 10B shown in FIG. 17 is different from the substrate processing system 10 in that a loader module 12B is provided instead of the loader module 12. In addition, the loader module 12B is different from the loader module 12 in that a storage unit 30B is provided instead of the storage unit 30. Hereinafter, the storage unit 30B will be described.

FIG. 18 is a sectional view showing a storage unit according to still another exemplary embodiment. The storage unit 30B shown in FIG. 18 includes a container 32B, a single rectifying plate 34, and an exhaust duct 36B. The container 32B includes a container body 38B and a single support 40. The container body 38B includes an outer wall 38Ba and partition walls 38Bb. The outer wall 38Ba has an approximately box shape, and provides an internal space SI which is opened at a front side thereof. The front end of the outer wall 38Ba is connected to the chamber body 12m of the loader module 12B. Accordingly, the transfer chamber 12c inside the chamber body 12m of the loader module 12B and the internal space SI communicate with each other.

The partition walls 38Bb are interposed between the outer walls 38Ba and the rectifying plate 34, and the partition walls 38Bb and the rectifying plate 34 divide the internal space SI into a front space SF and a second space S2 which is positioned behind the front space SF.

The support 40 is provided in the front space SF. The support 40 defines the first space SI in the front space SF. The support 40 has the same configuration as those of the supports 401 and 402 shown in FIG. 6. Hereinafter, a first direction orthogonal to the rectifying plate 34 is referred to as the direction D1. In addition, a second direction orthogonal to the direction D1 and the vertical direction (direction VD), that is, a width direction of the first space S1 is referred to as a direction D2.

Figure 19:
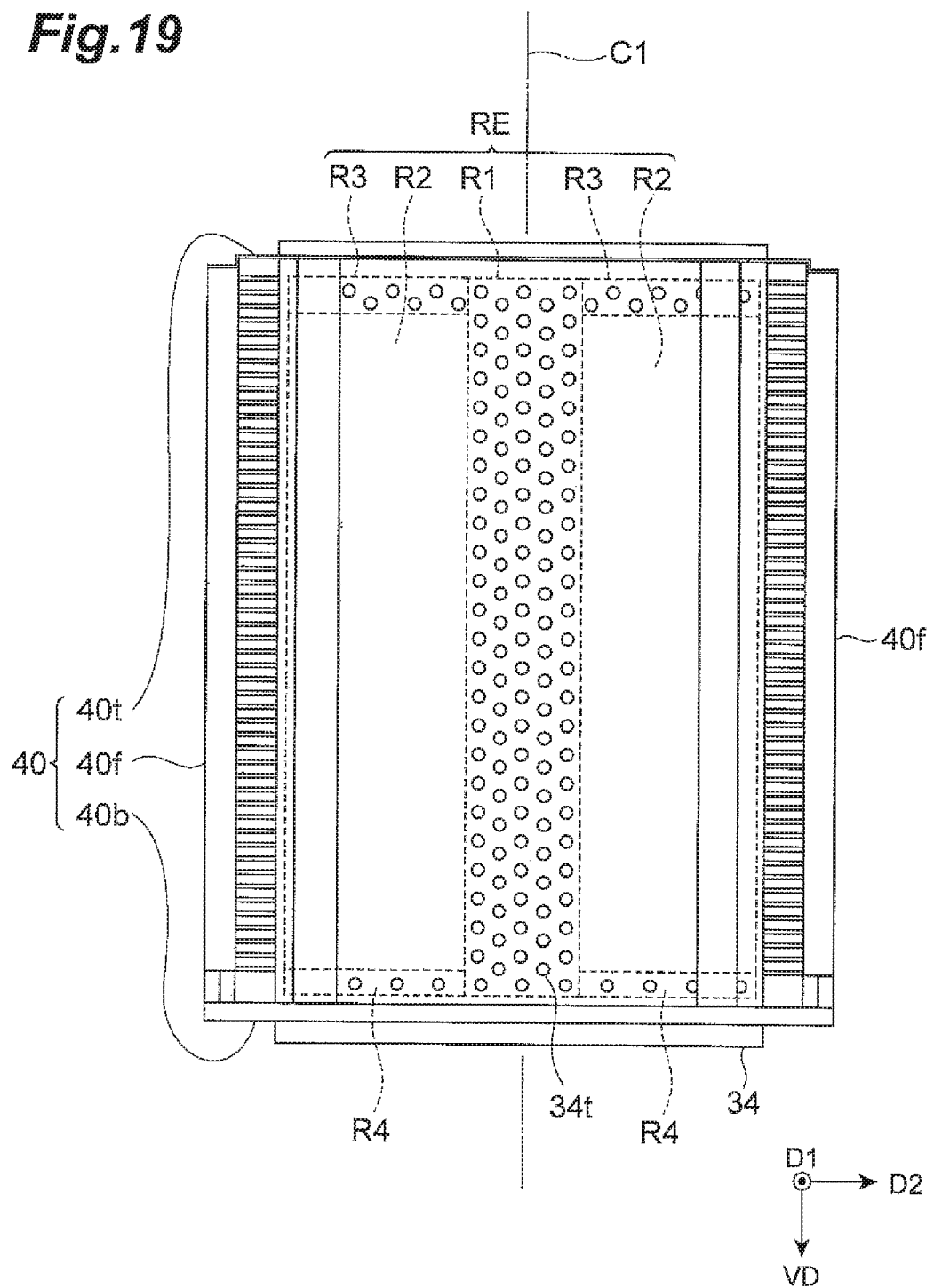
FIG. 19 is a plan view illustrating a rectifying plate and a support.

The rectifying plate 34 is provided between the first space S1 and the second space S2. FIG. 19 is a plan view illustrating a rectifying plate and a support. The rectifying plate 34 is a member having a plate shape which has an approximately rectangular plane shape. One main surface of the rectifying plate 34 faces the first space S1 side, and another main surface thereof faces the second space S2 side.

The rectifying plate 34 includes an effective region RE. The effective region RE is a region which faces the first space S1 and is interposed between the first space S1 and the second space S2. The rectifying plate 34 further includes an edge region around the effective region RE. The edge region is a region which is supported by the container body 38B and is not related to the flow of gas between the first space S1 and the second space S2.

The effective region RE includes a first region R1 and a second region R2. In one embodiment, the effective region RE may thither include a third region R3. The first region R1 has a band shape, and faces a center C1 of the first space S1 in the direction D2 (width direction), along the direction D1. That is, the first region R1 is a region having a hand shape which faces the center of each of the plurality of wafers W which are stacked in the first space S1. In the first region R1, a plurality of through holes 34t are formed to be distributed over the entire first region R1.

The second region R2 is an approximately rectangular region, and extends on both sides of the first region R1 in the direction, D2. The second region R2 is a region which faces both marginal regions of the first space S1 in the direction D2. In the present embodiment, the second region R2 symmetrically extends with respect to an opening 36Ba of the second space S2 side of the exhaust duct 36B. The second region R2 has a conductance which is lower than a conductance of the first region R1. For example, in order to provide such a conductance to the second region R2, through holes are not formed in the second region R2.

The third region R3 extends on an upper side of the second region R2. The plurality of through holes 34t are also formed in the third region R3 to be distributed over the entire third region R1.

The effective region RE of the rectifying plate 34 may further include a fourth region R4 which extends on a lower side of the second region R2. The plurality of through holes 34t are formed in the fourth region R4 to be distributed over the entire fourth region R4.

Figure 20:
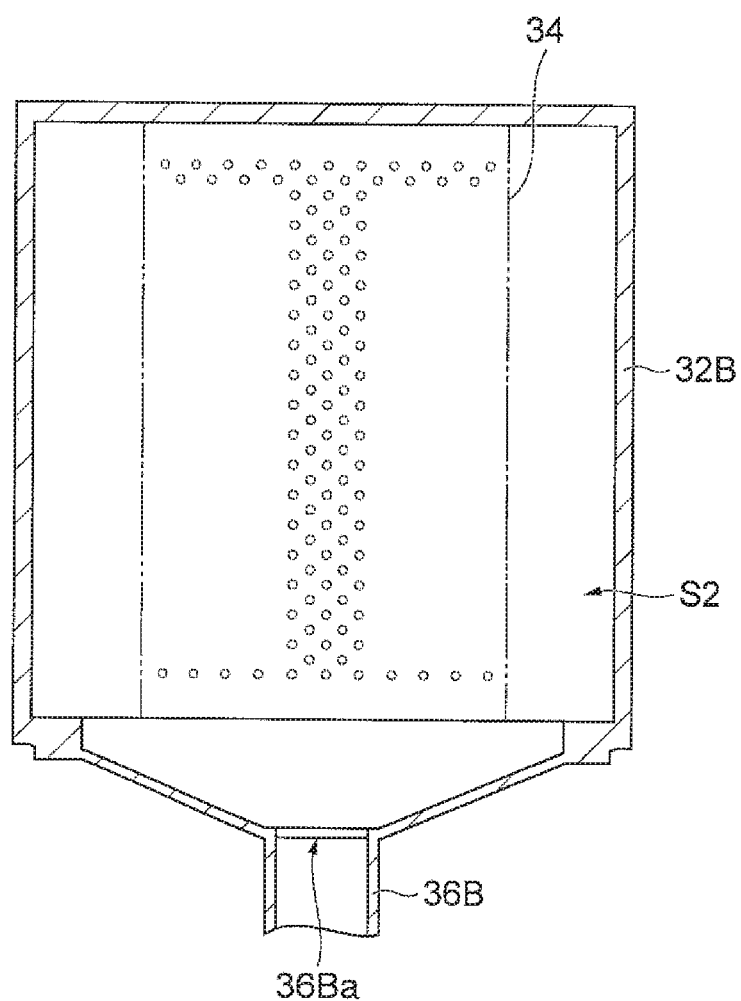
FIG. 20 is another sectional view of the storage unit shown in FIG. 18.

Reference is made to FIG. 18 again. Moreover, reference is made to FIG. 20, in addition to FIG. 18. FIG. 20 is another sectional view illustrating the storage unit shown in FIG. 18, and shows a cross section in which the storage unit is sectioned along a plane which extends in the width direction and the vertical direction and passes through the second space.

The exhaust duct 36B is connected to the container 32B. The exhaust duct 36B communicates with the second space S2, and provides the opening 36Ba (opening of the second space S2 side) below the second space S2. The opening 36Ba is positioned below the center of the second space S2 in the direction D2. The exhaust box 44 is connected to a downstream side of the exhaust duct 36B, and another exhaust duct 46 is connected to a downstream side of the exhaust box 44.

In the storage unit 30B, since the rectifying plate 34 having the above-described first region R1 and second region R2 is interposed between the first space S1 and the second space S2, the difference in the conductance between paths of the gas, which reaches the second space S2 from the first space S1 via the rectifying plate 34, decreases. As a result, nonuniformity in the flow of the gas flowing along each of the plurality of wafers W stored in, the first space S1 decreases. Accordingly, it is possible to decrease the amount of the adhered matters on the plurality of wafers W stored in the first space S1.

Moreover, the second region R2 of the rectifying plate 34 symmetrically extends with respect to the opening 36Ba of the exhaust duct 36B. Accordingly, the difference in the conductance between the paths of the gas from the first space S1 to the opening 36Ba of the exhaust duct 36B decreases.

In addition, The third region R3 decreases the difference between the conductance of the path of the gas reaching the opening 36Ba of the exhaust duct 36B from the first space S1 via the upper portion of the rectifying plate 34, and the conductance of the path of the gas reaching the opening 36Ba of the exhaust duet 36B from the first space S1 via the lower portion of the rectifying plate 34.

Hereinbefore, various embodiments has been described. However, various modifications may be made without being limited to the above-described embodiments. For example, in the processing system, the number of the pedestals on which the FOUPs are mounted, the number of the load lock modules, the number of the process modules, or the like can be arbitrarily selected. In addition, a layout of components of the substrate processing system may be different from the layouts of the above-described embodiments.

From the foregoing description, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A storage unit which stores a substrate for cleaning, comprising:
   a container which is open to a front side and provides a first space in which a plurality of substrates are to be stacked in a vertical direction and a second space behind the first space;
   a support provided in the container, defining the first space, and providing a plurality of slots arranged along the vertical direction in the first space, in which the plurality of substrates are to be stored, respectively;
   a rectifying plate provided between the first space and the second space; and
   an exhaust duct connected to the container and providing an opening below the second space to communicate with the second space,
   wherein the rectifying plate has an effective region facing the first space along a first direction, the first direction being orthogonal to the rectifying plate,
   wherein the effective region includes a first region facing a center of the first space in a second direction orthogonal to the first direction and the vertical direction and facing the plurality of slots, a second region extending on one side or both sides of the first region in the second direction and facing multiple of the plurality of slots, and a third region extending in the second direction directly above an upper side of the second region and facing others of the plurality of slots,
   wherein a plurality of through holes are formed in the first region to be distributed over the first region,
   wherein no through holes are provided over an entire height of the second region,
   wherein a plurality of through holes are formed in the third region to be distributed over the third region,
   wherein the second region is closer to the opening of the exhaust duct than the first region in the second direction,
   wherein the container further provides an other first space in which a plurality of substrates are to be stacked in the vertical direction, wherein the storage unit comprises the rectifying plate as a first rectifying plate and further comprises a second rectifying plate provided between the other first space and the second space, wherein the second rectifying plate has an effective region facing the other first space along an other first direction, the other first direction being orthogonal to the second rectifying plate, wherein the effective region of the second rectifying plate includes an other first region facing a center of the other first space in an other second direction orthogonal to the other first direction and the vertical direction, and an other second region extending on one side or both sides of the other first region in the other second direction, wherein a plurality of through holes are formed in the other first region to be distributed over the other first region, and wherein the other second region provides no through holes.

2. The storage unit according to claim 1, wherein the second region extends on the both sides of the first region in the second direction, and extends symmetrically in the second direction with respect to the opening of the exhaust duct of a second space side.

3. The storage unit according to claim 1, wherein the first region extends to face the center of each of the plurality of substrates to be stacked in the first space.

4. The storage unit according to claim 1, wherein the rectifying plate is a member having a plate shape which has an approximately rectangular plane shape.

5. The storage unit according to claim 1, wherein a shape of each of the plurality of through holes is a circle.

6. The storage unit according to claim 1, wherein a pressure in the second space is lower than a pressure in the first space.

7. The transfer apparatus according to claim 1, wherein the first region has a band shape and the second region has a rectangular shape.

8. A transfer apparatus, comprising:
a chamber body providing a transfer chamber;
a transfer robot provided in the transfer chamber;
the storage unit according to claim 1, connected to the chamber body, the first space communicating with the transfer chamber; and
a blower configured to generate a flow of gas toward the transfer chamber and the first space.

9. A substrate processing system, comprising:
the transfer apparatus according to claim 8,
a load lock module providing a preliminary depressurized chamber, and is connected to the chamber body of the transfer apparatus;
a transfer module providing a depressurizable transfer chamber, includes the transfer robot in the depressurizable transfer chamber, and connected to the load lock module; and
a process module configured to process a substrate and connected to the transfer module.

10. The transfer apparatus according to claim 8, wherein a part of the gas generated by the blower flows into the first space from an opening of the first space and is discharged from the second space via the exhaust duct.

11. The transfer apparatus according to claim 10, wherein the blower is provided above the storage unit.

12. The transfer apparatus according to claim 10, wherein another part of the gas generated by the blower is discharged from a duct which is provided below the transfer chamber independently from the exhaust duct.

13. The transfer apparatus according to claim 8, wherein the storage unit is provided on a side opposite to a side on which a pedestal is provided with respect to the transfer robot, and a FOUP which accommodates a plurality of substrates therein is provided on the pedestal.

14. A storage unit which stores a substrate for cleaning, comprising:
a container which is open to a front side and provides a first space in which a plurality of substrates are to be stacked in a vertical direction and a second space behind the first space;
a support provided in the container, defining the first space, and providing a plurality of slots arranged along the vertical direction in the first space, in which the plurality of substrates are to be stored, respectively;
a rectifying plate provided between the first space and the second space; and
an exhaust duct connected to the container and providing an opening below the second space to communicate with the second space,
wherein the rectifying plate has an effective region facing the first space along a first direction, the first direction being orthogonal to the rectifying plate,
wherein the effective region includes a first region facing a center of the first space in a second direction orthogonal to the first direction and the vertical direction and facing the plurality of slots, a second region extending on one side or both sides of the first region in the second direction and facing multiple of the plurality of slots, and a third region extending in the second direction directly above an upper side of the second region and facing others of the plurality of slots,
wherein a plurality of through holes are formed in the first region to be distributed over the first region,
wherein no through holes are provided over an entire height of the second region,
wherein a plurality of through holes are formed in the third region to be distributed over the third region,
wherein the container further provides an other first space in which a plurality of substrates are to be stacked in the vertical direction, and
wherein the storage unit comprises the rectifying plate as a first rectifying plate and further comprises a second rectifying plate provided between the other first space and the second space,
the second rectifying plate has an effective region facing the other first space along an other first direction, the other first direction being orthogonal to the second rectifying plate,
the effective region of the second rectifying plate includes an other first region facing a center of the other first space in an other second direction orthogonal to the other first direction and the vertical direction, and an other second region extending on one side or both sides of the other first region in the other second direction,
a plurality of through holes are formed in the other first region to be distributed over the other first region, and
the other second region provides no through holes.

* * * * *